(12) United States Patent
Nakagawa et al.

(10) Patent No.: US 7,291,554 B2
(45) Date of Patent: Nov. 6, 2007

(54) METHOD FOR FORMING SEMICONDUCTOR DEVICE

(75) Inventors: Hideo Nakagawa, Shiga (JP); Masaru Sasago, Osaka (JP); Yoshihiko Hirai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 325 days.

(21) Appl. No.: 11/090,885

(22) Filed: Mar. 28, 2005

(65) Prior Publication Data

US 2005/0164494 A1 Jul. 28, 2005

Related U.S. Application Data

(63) Continuation of application No. PCT/JP2004/008655, filed on Jun. 14, 2004.

(30) Foreign Application Priority Data

Jun. 20, 2003 (JP) .............................. 2003-175883

(51) Int. Cl.
*H01L 21/28* (2006.01)
(52) U.S. Cl. ............................... 438/637; 257/E21.206
(58) Field of Classification Search ................ 438/620; 257/E21.237
See application file for complete search history.

(56) References Cited

U.S. PATENT DOCUMENTS 5,772,905 A 6/1998 Chou

2002/0066672 A1* 6/2002 Iijima et al. ................ 205/125
2002/0115002 A1* 8/2002 Bailey et al. ................... 430/5
2004/0224261 A1* 11/2004 Resnick et al. ............. 430/311

FOREIGN PATENT DOCUMENTS

JP 06-267943 9/1994

(Continued)

OTHER PUBLICATIONS

Chou et al., "Imprint of sub-25 nm vias and trenches in polymers", Applied Physics Letter, vol. 67 (1995) pp. 3114-3116.

*Primary Examiner*—Carl W. Whitehead, Jr.
*Assistant Examiner*—Jennifer M. Dolan
(74) *Attorney, Agent, or Firm*—McDermott Will & Emery LLP

(57) ABSTRACT

A method for forming a semiconductor device includes the steps of forming a flowable film made of an insulating material with flowability; forming a first concave portion in the flowable film through transfer of a convex portion of a pressing face of a pressing member by pressing the pressing member against the flowable film; forming a solidified film having the first concave portion by solidifying the flowable film through annealing at a first temperature with the pressing member pressed against the flowable film; forming a burnt film having the first concave portion by burning the solidified film through annealing at a second temperature higher than the first temperature; forming a second concave portion connected at least to the first concave portion in the burnt film by forming, on the burnt film, a mask having an opening for forming the second concave portion and etching the burnt film by using the mask; and forming a plug and a metal interconnect by filing the first concave portion and the second concave portion of the burnt film with a conductive film.

40 Claims, 20 Drawing Sheets

FOREIGN PATENT DOCUMENTS

| | | | |
|---|---|---|---|
| JP | 06267943 A * | 9/1994 |
| JP | 07-121914 | 5/1995 |
| JP | 2000-194142 | 7/2000 |
| JP | 2001-252927 | 9/2001 |
| JP | 2001252927 A * | 9/2001 |
| JP | 2002-158221 | 5/2002 |
| JP | 2002158221 A * | 5/2002 |
| JP | 2003-077807 | 3/2003 |

* cited by examiner

METHOD FOR FORMING SEMICONDUCTOR DEVICE

This application is a continuation of PCT/JP2004/008655, filed on Jun. 14, 2004.

BACKGROUND OF THE INVENTION

In a method for forming multilayered interconnects in formation process for semiconductor devices, with respect to a generation of a design rule of 130 nm or less, a damascene method in which a concave portion (a via hole or an interconnect groove) is formed in an insulating film, the concave portion is filled with a metal film principally by a metal plating method and the metal film is planarized by chemical mechanical polishing (CMP) is employed for forming a buried interconnect. In this case, as a method for forming a concave portion in an insulating film, apart from conventionally known dry etching, nano-imprint lithography proposed by S. Y Chou, et al. in Non-patent Document 1 (Applied Physics Letter, Volume 67 (1995), pp. 3114-3116) or Patent Document 1 (U.S. Pat. No. 5,772,905 (Jun. 30, 1998)) is known.

Now, a conventional method for forming a semiconductor device by using the nano-imprint lithography will be described with reference to FIGS. 17A through 17E.

First, as shown in FIG. 17A, a film 102A of a thermosetting resin is formed on a substrate (semiconductor wafer) 101 in a surface portion of which devices such as transistors and interconnects (not shown in the drawing) have been formed, and thereafter, as shown in FIG. 17B, a pressing face of a mold 103 having a convex portion 104 on the pressing face is pressed against the film 102A, so as to transfer the convex portion 104 of the mold 103 onto the film 102A.

Next, as shown in FIG. 17C, with a pressure applied to the mold 103, the substrate 101 is annealed for curing the film 102A, so as to form a cured film 102B. In the case where the film 102A is made of a photo-setting resin, the cured film 102B is formed through irradiation with light of UV or the like with a pressure applied to the mold 103.

Then, as shown in FIG. 17D, the mold 103 is moved away from the cured film 102B, and thus, a concave portion 105 is formed in the cured film 102B through the transfer of the convex portion 104 of the mold 103.

Next, the whole cured film 102B is subjected to anisotropic dry etching (anisotropic etch back), so as to remove a portion of the cured film 102B remaining on the bottom of the concave portion 105 as shown in FIG. 17E.

S. Y. Chou et al. use PMMA (polymethyl methacrylate), that is, a resist material, as the material for the film 102A, and after curing the PMMA once, the concave portion 105 is formed by pressing the mold 103 against the film 102A with the PMMA slightly softened through annealing at 200° C. In this case, since the PMMA has been cured, a high pressure as high as 140 atmospheric pressures is disadvantageously necessary for forming the concave portion 105.

Therefore, in order to overcome this disadvantage, according to Patent Document 2 (Japanese Laid-Open Patent Publication No. 2000-194142), a photo-setting material film made of a liquid photo-setting material is used as the film 102A and the film 102A is cured through annealing and light irradiation with the mold 103 pressed against the film 102A. Thus, the applied pressure is reduced to several atmospheric pressures, and hence, the accuracy in horizontal positions of the mold 103 and the substrate 101 is improved.

At this point, a method for forming a buried interconnect included in multilayered interconnects by the damascene method will be described. In general, a method for forming a buried plug or a buried interconnect alone by the damascene method is designated as a single damascene method, and a method for forming both a buried plug and a buried interconnect simultaneously by the damascene method is designated as a dual damascene method.

Now, a formation method for a semiconductor device in which a plug or a metal interconnect is formed by the single damascene method will be described with reference to FIGS. 18A through 18E.

First, as shown in FIG. 18A, an insulating film 112 of, for example, a silicon oxide film is formed on a substrate (semiconductor wafer) 111 by, for example, a chemical vapor deposition (CVD) method or a spin on dielectric (SOD) method.

Next, as shown in FIG. 18B, a resist pattern 113 having an opening for forming a via hole or an interconnect groove is formed on the insulating film 112 by lithography. Thereafter, as shown in FIG. 18C, the insulating film 112 is dry etched by using the resist pattern 113 as a mask, thereby forming a concave portion 114 corresponding to a via hole or an interconnect groove in the insulating film 112.

Then, as shown in FIG. 18D, after forming a barrier metal film (not shown in the drawing) by, for example, a sputtering method, a copper film 115 is deposited on the barrier metal film by, for example, a plating method.

Next, as shown in FIG. 18E, an unnecessary portion of the copper film 115, namely, a portion thereof exposed above the insulating film 112, is removed by chemical mechanical polishing (CMP), so as to form a plug or metal interconnect 116 made of the copper film 115.

Now, a formation method for a semiconductor device in which a plug and a metal interconnect are formed by the dual damascene method will be described with reference to FIGS. 19A through 19D and 20A through 20D. Herein, a process in which a plug and a metal interconnect are formed by forming a via hole before forming an interconnect groove and filling a metal film in the via hole and the interconnect groove, namely, what is called via first process, will be described.

First, as shown in FIG. 19A, an insulating film 112 of, for example, a silicon oxide film is formed on a substrate (semiconductor wafer) 121 by, for example, the chemical vapor deposition method or the spin on dielectric method.

Next, as shown in FIG. 19B, a first resist pattern 123 having an opening for forming a via hole is formed on the insulating film 122 by the lithography, and thereafter, as shown in FIG. 19C, the insulating film 122 is dry etched by using the first resist pattern 123 as a mask, thereby forming a via hole 124 in the insulating film 122.

Then, as shown in FIG. 19D, after forming a bottom antireflection coating (BARC) 125 on the insulating film 122 including the inside of the via hole 124, a second resist pattern 126 having an opening for forming an interconnect groove is formed on the bottom antireflection coating 125.

Next, as shown in FIG. 20A, the bottom antireflection coating 125 is dry etched by using the second resist pattern 126 as a mask, so as to allow a portion of the bottom antireflection coating 125 to remain in a lower portion of the via hole 124. Thereafter, as shown in FIG. 20B, the insulating film 122 is dry etched by using the second resist pattern 126 and the bottom antireflection coating 125 as a mask, thereby forming an interconnect groove 127 in the insulating film 122.

Subsequently, after removing the second resist pattern 126 and the bottom antireflection coating 125 by ashing and cleaning, a barrier metal film (not shown in the drawing) is formed by the sputtering method. Thereafter, a copper film 128 is deposited on the barrier metal film by the plating method, so as to fill the via hole 124 and the interconnect groove 127 with the copper film 128.

Next, as shown in FIG. 20C, an unnecessary portion of the copper film 128, namely, a portion thereof exposed above the insulating film 122, is removed by the chemical mechanical polishing. Thus, as shown in FIG. 20D, a plug 130 and a metal interconnect 131 made of the copper film 128 are formed at the same time.

SUMMARY OF THE INVENTION

An object of the invention is forming, through a small number of processes, an insulating film with an interconnect groove or a via hole that has a uniform structure of the basic skeleton for attaining improved film quality.

In order to achieve the object, the method for forming a semiconductor device of this invention includes the steps of forming a flowable film made of an insulating material with flowability; forming a first concave portion in the flowable film through transfer of a convex portion of a pressing face of a pressing member by pressing the pressing member against the flowable film; forming a solidified film having the first concave portion by solidifying the flowable film through annealing at a first temperature with the pressing member pressed against the flowable film; forming a burnt film having the first concave portion by burning the solidified film through annealing at a second temperature higher than the first temperature; forming a second concave portion connected at least to the first concave portion in the burnt film by forming, on the burnt film, a mask having an opening for forming the second concave portion and etching the burnt film by using the mask; and forming a plug and a metal interconnect by filing the first concave portion and the second concave portion of the burnt film with a conductive film.

In the method for forming a semiconductor device of this invention, after forming, onto the flowable film, the convex portion provided on the pressing face of the pressing member, the burnt film is formed by solidifying and burning the flowable film. Therefore, an insulating film made of the burnt film can be formed through a small number of processes. Also, in the step of forming the solidified film, the annealing is performed at the first temperature that is a relatively low temperature, and thus, the basic skeleton of the solidified film (such as a polymer skeleton of an organic film or a siloxane skeleton of a silicon oxide film or an organic-inorganic film) is formed. Thereafter, in the step of forming the burnt film, the annealing is performed at the second temperature that is a relatively high temperature, so as to vaporize porogen such as an acrylic polymer, a remaining solvent or the like from the solidified film. Therefore, as compared with the case where formation of a basic skeleton and vaporization of the porogen, a remaining solvent or the like are performed in parallel, the structure of the basic skeleton of the burnt film is made uniform, resulting in improving the film quality of the insulating film made of the burnt film having a via hole and an interconnect groove. Accordingly, the dielectric constant of the insulating film is uniform within the whole film, and hence, the reliability of the method for forming a semiconductor device including a plug and a metal interconnect formed by the dual damascene method can be improved.

In the method for forming a semiconductor device of this invention, the first temperature is preferably approximately 150° C. through approximately 300° C.

Thus, the basic skeleton of the flowable film can be formed without vaporizing porogen or the like included in the flowable film.

In the method for forming a semiconductor device of this invention, the second temperature is preferably approximately 350° C. through approximately 450° C.

Thus, the porogen or the like can be vaporized from the solidified film without degrading the film quality of the solidified film and also the film quality of the pattern.

In the method for forming a semiconductor device of this invention, it is preferred that the first concave portion corresponds to an interconnect groove and the second concave portion corresponds to a via hole.

Thus, a trench first process can be definitely performed.

In the method for forming a semiconductor device of this invention, it is preferred that the first concave portion corresponds to a via hole and the second concave portion corresponds to an interconnect groove.

Thus, a via first process can be definitely performed.

In the method for forming a semiconductor device of this invention, the insulating material with flowability is preferably in the form of a liquid or a gel.

Thus, the flowable film can be easily and definitely formed.

In the method for forming a semiconductor device of this invention, in the step of forming a flowable film, the flowable film is preferably formed on a substrate by supplying the insulating material with flowability onto the substrate rotated.

Thus, the thickness of the flowable film can be made uniform.

In the method for forming a semiconductor device of this invention, in the step of forming a flowable film, the flowable film is preferably formed on a substrate by supplying the insulating material with flowability onto the substrate and rotating the substrate after the supply.

Thus, the thickness of the flowable film can be made uniform.

In the method for forming a semiconductor device of this invention, in the step of forming a flowable film, the flowable film is preferably formed on a substrate by supplying, in the form of a shower or a spray, the insulating material with flowability onto the substrate rotated.

Thus, the flowable film can be definitely formed in a comparatively small thickness.

In the method for forming a semiconductor device of this invention, in the step of forming a flowable film, the flowable film is preferably formed on a substrate by supplying the insulating material with flowability from a fine spray vent of a nozzle onto the substrate with the nozzle having the fine spray vent and the substrate relatively moved along plane directions.

Thus, the thickness of the flowable film can be controlled to be a desired thickness by adjusting the relative moving rates of the nozzle and the substrate. Also, the degree of the flowability of the flowable film can be changed by adjusting the viscosity of the insulating material with flowability. Furthermore, the process speed can be controlled by adjusting the number of nozzles.

In the method for forming a semiconductor device of this invention, in the step of forming a flowable film, the flowable film is preferably formed on a substrate by supplying the insulating material with flowability having been adhered to a surface of a roller onto the substrate with the roller rotated.

Thus, the thickness of the flowable film can be controlled by adjusting a distance between the roller and the substrate and a force for pressing the roller against the substrate. Also, a material with flowability and high viscosity can be used.

The method for forming a semiconductor device of this invention preferably further includes, between the step of forming a flowable film and the step of forming a first concave portion, a step of selectively removing a peripheral portion of the flowable film.

Thus, the peripheral portion of the substrate can be mechanically held in the process for forming the pattern.

In the case where the method for forming a semiconductor device of this invention includes the step of selectively removing a peripheral portion of the flowable film, this step is preferably performed by supplying a solution for dissolving the insulating material with flowability onto the peripheral portion of the flowable film with the flowable film rotated.

Thus, the flowable film can be definitely removed from a peripheral portion of a substrate in the plane shape of a circle or a polygon with a large number of vertexes.

In the case where the method for forming a semiconductor device of this invention includes the step of selectively removing a peripheral portion of the flowable film, this step is preferably performed by modifying the peripheral portion of the flowable film through irradiation with light and removing the modified peripheral portion.

Thus, the flowable film can be definitely removed from a peripheral portion of a substrate not only in the plane shape of a circle or a polygon with a large number of vertexes but also in the shape of a polygon with a small number of vertexes such as a triangle or a rectangle.

In the method for forming a semiconductor device of this invention, it is preferred that the flowable film is formed on a substrate, and that in the step of forming a first concave portion, a plurality of distances between a surface of the substrate and the pressing face are measured, and the flowable film is pressed with the pressing face in such a manner that the plurality of distances are equal to one another.

Thus, a distance of the surface of the flowable film from the surface of the substrate can be always made uniform, and therefore, an operation for making uniform a distance between the surface of the substrate and the pressing face of the pressing member every given period of time can be omitted.

In the method for forming a semiconductor device of this invention, in the case where the plurality of distances are measured, the distances are preferably measured by measuring capacitance per unit area in respective measurement positions.

Thus, the plural distances can be easily and definitely measured.

In the method for forming a semiconductor device of this invention, it is preferred that the flowable film is formed on a substrate, and that in the step of forming a first concave portion, a plurality of distances between a surface of a stage where the substrate is placed and the pressing face are measured, and the flowable film is pressed with the pressing face in such a manner that the plurality of distances are equal to one another.

Thus, a distance of the surface of the flowable film from the surface of the substrate can be always made uniform, and therefore, an operation for making uniform a distance between the surface of the substrate and the pressing face of the pressing member every given period of time can be omitted.

In the method for forming a semiconductor device of this invention, the pressing face of the pressing member preferably has a hydrophobic property.

Thus, the pressing member can be easily moved away from the solidified film, and hence, a pattern with fewer defects can be formed.

In the method for forming a semiconductor device of this invention, it is preferred that the insulating material with flowability is a photo-setting resin, and that the step of forming a solidified film includes a sub-step of irradiating the flowable film with light.

Thus, the flowable film can be easily and rapidly solidified through a photochemical reaction and a thermal chemical reaction.

In the method for forming a semiconductor device of this invention, the insulating material with flowability may be an organic material, an inorganic material, an organic-inorganic material, a photo-setting resin or a photosensitive resin.

In the method for forming a semiconductor device of this invention, in the step of forming a burnt film, the solidified film is preferably annealed at the second temperature with the pressing face pressed against the solidified film.

Thus, the shape of the first concave portion formed in the solidified film can be highly accurately kept.

In the method for forming a semiconductor device of this invention, in the step of forming a burnt film, the solidified film is preferably annealed at the second temperature with the pressing face moved away from the solidified film.

Thus, the porogen, the remaining solvent or the like included in the solidified film can be easily vaporized.

In the method for forming a semiconductor device of this invention, the burnt film is preferably a porous film.

Thus, an insulating film with a low dielectric constant can be formed.

In the method for forming a semiconductor device of this invention, the burnt film preferably has a dielectric constant of approximately 4 or less.

Thus, the dielectric constant of the insulating film can be definitely lowered, so as to reduce capacitance between metal interconnects.

Furthermore, this invention provides one solution for the problem that the cost of the formation process for the semiconductor device is high because the number of processes is large, in the case where multilayered interconnects are formed by a damascene method.

Additionally this invention provides one solution for the problem that a focal depth becomes insufficient in the lithography because of increasing a global level difference where multilayered interconnects are formed by repeating the damascene method in which a buried interconnect is formed by depositing a metal film on an insulating film for filling a concave portion formed in the insulating film and removing an unnecessary portion of the metal film by the CMP.

In another way, the nano-imprint lithography is applied instead of a combination of the resist pattern formation by the lithography and the dry etching, in the process for forming a concave portion (a via hole or an interconnect groove) in an insulating film, so as to reduce the number of processes for lowering the cost.

In the case where the nano-imprint lithography is applied to an insulating film to be used as an interlayer insulating film, in order to secure stability of the insulating film in semiconductor formation process performed thereafter, a process for curing the insulating material by annealing it at a temperature of approximately 400° C. is generally necessary.

The conventional nano-imprint lithography is, however, carried out for forming a resist pattern, and hence, the annealing temperature is approximately 200° C. at most.

If the insulating material is annealed at a temperature of approximately 350° C. or more for applying the insulating film to the nano-imprint lithography for forming a concave portion, the structure of the basic skeleton of the insulating film becomes locally ununiform, and hence, the film quality is degraded in such a manner that the dielectric constant of the insulating film is different depending upon the position in the insulating film.

Therefore, this invention provides one solution for the problem that the performance and the reliability of the semiconductor device are largely degraded because of insufficient reliability of an insulating film

DESCRIPTION OF THE EMBODIMENTS

Embodiment 1

A method for forming a semiconductor device according to Embodiment 1 will now be described with reference to FIGS. 1A through 1D, 2A through 2D and 3A through 3C.

Figure 1A:
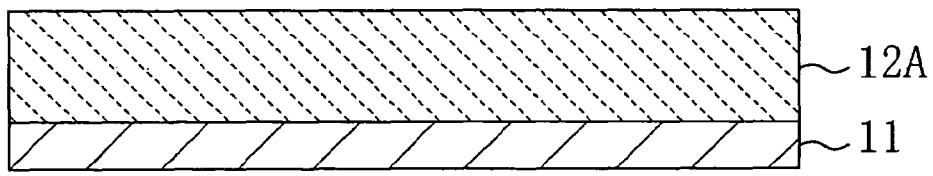
FIGS. 1A through 1D are cross-sectional views for showing procedures in a method for forming a semiconductor device according to Embodiment 1.

First, as shown in FIG. 1A, after forming an interlayer insulating film on a semiconductor substrate, a lower metal interconnect is buried in an upper portion of the interlayer insulating film and a diffusion preventing film is formed on the lower metal interconnect and the interlayer insulating film. Thus, a substrate 11 having the interlayer insulating film, the lower metal interconnect and the diffusion preventing film formed on the semiconductor substrate is obtained. The shape of the substrate 11 is not particularly specified and may be any shape including a circle, a polygon and the like, and is not limited to a plane shape. The diffusion preventing film has a function to prevent a metal included in the lower buried interconnect from diffusing into an insulating film to be formed on the buried interconnect.

Next, an insulating material with flowability, such as an insulating material in the form of a liquid or a gel, is supplied onto the substrate 11, so as to form a film with flowability (hereinafter simply referred to as the flowable film) 12A. In general, annealing is performed at approximately 80° C. through 120° C. in order to vaporize a part or most of a solvent included in the flowable film 12A formed on the substrate 11. This annealing is generally designated as pre-bake, and the temperature of the pre-bake may be set so that the flowability of the flowable film 12A can be kept in a transferring process subsequently performed. Specifically, the temperature may be set in accordance with the characteristics (such as the boiling point) of the solvent used for supplying the material with flowability, and the pre-bake may be omitted in some cases.

The flowable film 12A may be, for example, an organic film, an inorganic film, an organic-inorganic film (organic-inorganic hybrid film), a photo-setting resin film that is cured through irradiation with light, a porous film having a large number of pores with a diameter of approximately 1 nm through 10 nm therein, or the like.

A method for forming the flowable film 12A may be a spin coating method, a microscopic spraying method, a rotation roller method or the like, the thickness of the flowable film 12A is adjusted differently depending upon the employed method, and the film thickness can be adjusted by selecting the method for forming the flowable film 12A. The method for forming the flowable film 12A will be described in detail in Examples 1 through 4 below.

Figure 1B:
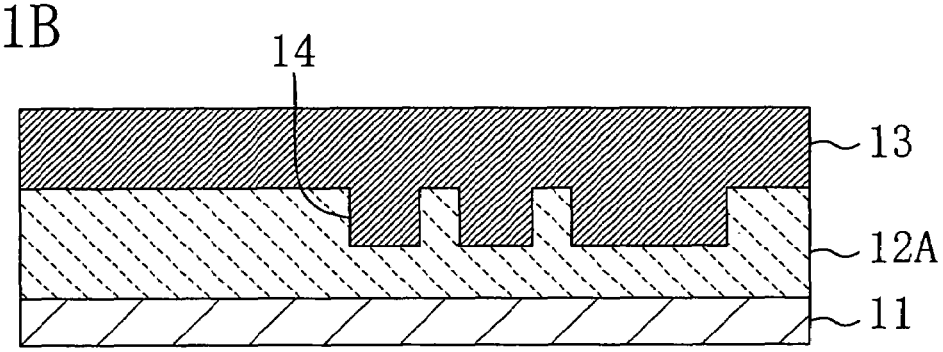
Figure 1C:
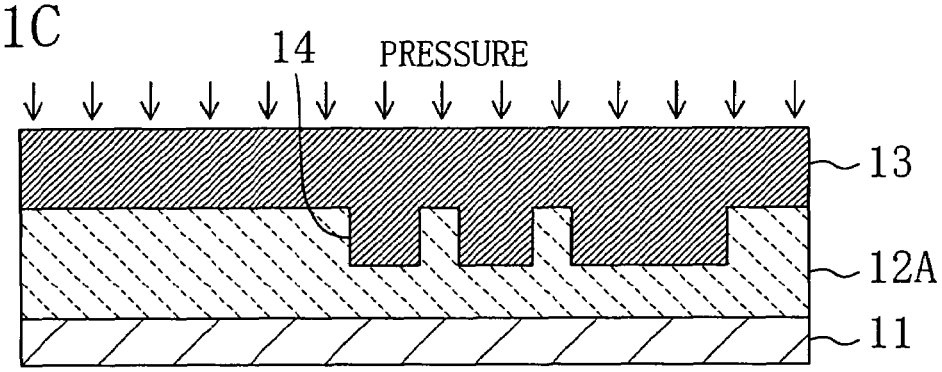

Next, as shown in FIG. 1B, a flat pressing face having a convex portion 14 in the shape of a line of a pressing member 13 is opposed to the surface of the flowable film 12A, and thereafter, a pressure toward the substrate is applied to the pressing member 13 as shown in FIG. 1C. Thus, the convex portion 14 is transferred onto the surface of the flowable film 12A and the whole top face of the flowable film 12A excluding a concave portion formed through the transfer of the convex portion 14 is planarized.

In this case, merely by pressing the flowable film 12A with the pressing face of the pressing member 13, the whole top face of the flowable film 12A excluding the portion where the convex portion has been transferred is planarized. However, when the press with the pressing member 13 is intermitted, the flowable film 12A is changed into an energetically stable shape owing to the surface tension of the flowable film 12A.

Figure 1D:
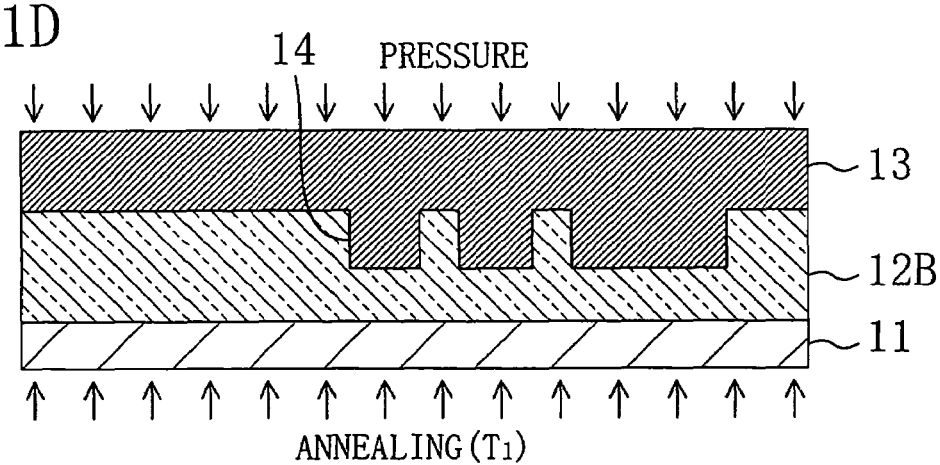

Therefore, as shown in FIG. 1D, with the pressing member 13 pressed against the flowable film 12A, the flowable film 12A is annealed at a first temperature (T1) so as to cause a chemical reaction within the flowable film 12A. Thus, the flowable film 12A is solidified, thereby forming a solidified film 12B made of the flowable film 12A solidified and having a first concave portion formed through the transfer of the convex portion 14. The first temperature (T1) is preferably approximately 150° C. through approximately 300° C. and is more preferably approximately 200° C. through approximately 250° C. In this manner, the basic skeleton of the flowable film 12A, such as a polymer skeleton or a siloxane skeleton, is definitely formed. In the solidifying process, the annealing is performed with a hot plate set to a desired temperature for approximately 2 through 3 minutes.

Figure 2A:
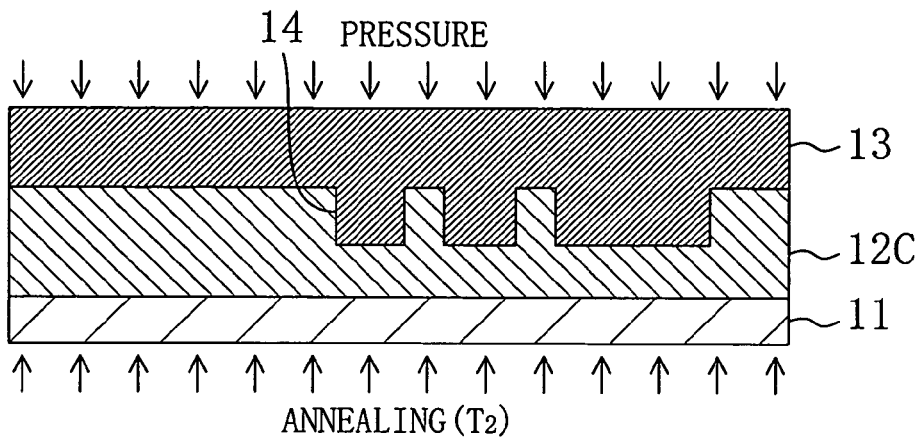
FIGS. 2A through 2D are cross-sectional views for showing other procedures in the method for forming a semiconductor device according to Embodiment 1.

Next, as shown in FIG. 2A, with the pressing member 13 pressed against the solidified film 12B, the solidified film 12B is annealed at a second temperature (T2) higher than the first temperature (T1) for burning the solidified film 12B. Thus, a burnt film 12C made of the solidified film 12B burnt and having the first concave portion is formed. The second temperature (T2) is preferably approximately 350° C. through approximately 450° C. In this manner, porogen or the like is vaporized from the solidified film 12B where the basic skeleton has been formed, and hence, the burnt film 12C with a uniform film quality can be obtained. In the burning process, the annealing is performed with a hot plate set to a desired temperature for approximately 2 through approximately 15 minutes.

Figure 2B:
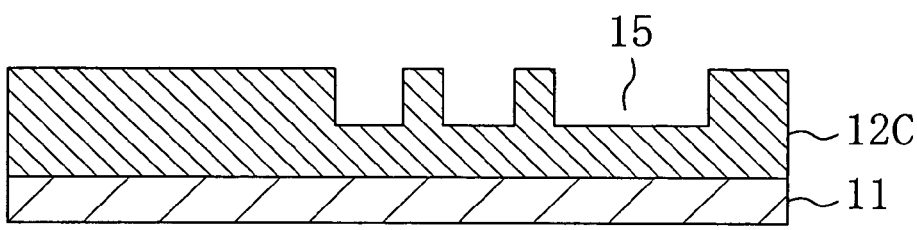

Next, after lowering the temperature of the burnt film 12C to a temperature range between approximately 100° C. and room temperature, the pressing member 13 is moved away from the burnt film 12C as shown in FIG. 2B, and thereafter, the temperature of the burnt film 12C is ultimately lowered to room temperature. Thus, the burnt film 12C that has a first concave portion 15 corresponding to an interconnect groove and formed through the transfer of the convex portion 14 of the pressing member 13 and is flat in its whole top face excluding the first concave portion 15 is obtained.

In order to provide the pressing face having the convex portion 14 of the pressing member 13 with a hydrophobic property, the pressing face is preferably subjected to a Teflon (registered trademark) coating treatment or a surface treatment with a silicon coupling material. Thus, the pressing member 13 can be easily moved away from the burnt film 12C, and hence, the burnt film 12C with fewer defects can be formed.

Now, materials with flowability will be described.

The insulating material with flowability used for forming an organic film is, for example, an aromatic polymer having aryl ether as a principal skeleton, and specific examples are FLARE and GX-3 (manufactured by Honeywell) and SiLK (manufactured by Dow Chemical).

The insulating material with flowability used for forming an inorganic film is, for example, HSQ (hydrogen silsquioxane) or organic SOG such as an alkylsiloxane polymer, and a specific example of the HSQ is Fox (manufactured by Dow Corning) and a specific example of the organic SOG is HSG-RZ25 (manufactured by Hitachi Chemical Co., Ltd.).

The insulating material with flowability used for forming an organic-inorganic film is, for example, organic siloxane having an organic group such as a methyl group in a siloxane skeleton, and a specific example is HOSP (hybrid organic siloxane polymer) (manufactured by Honeywell).

The insulating material with flowability used for forming a photo-setting resin film is, for example, PDGI (polydimethyl glutar imide), and a specific example is SAL 101 (manufactured by Shipley Far East).

The insulating material with flowability used for forming a porous film is, for example, an organic, inorganic or organic-inorganic material having pores, a specific example of the organic material having pores is Porous FLARE (manufactured by Honeywell), a specific example of the inorganic material having pores is XLK (manufactured by Dow Corning) having pores in HSQ (hydrogen silsquioxane), and specific examples of the organic-inorganic material having pores are Nanoglass (manufactured by Honeywell) and LKD-5109 (manufactured by JSR).

When the burnt film 12C obtained by solidifying and burning the flowable film 12A made of any of the aforementioned materials is used as an interlayer insulating film of multilayered interconnects, an interlayer insulating film that is dense and has a lower dielectric constant than a general silicon oxide film (with a dielectric constant of approximately 4) can be obtained. Therefore, a film suitable to a semiconductor device refined to 100 nm or less can be realized. In particular, when a porous film is used, an interlayer insulating film with a very low dielectric constant of 2 or less can be realized.

Figure 2C:
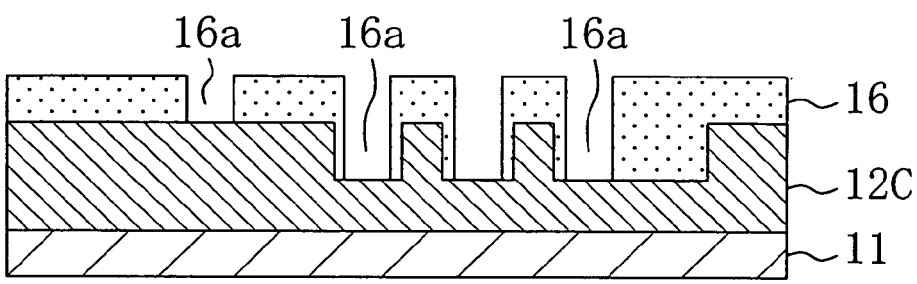
Figure 2D:
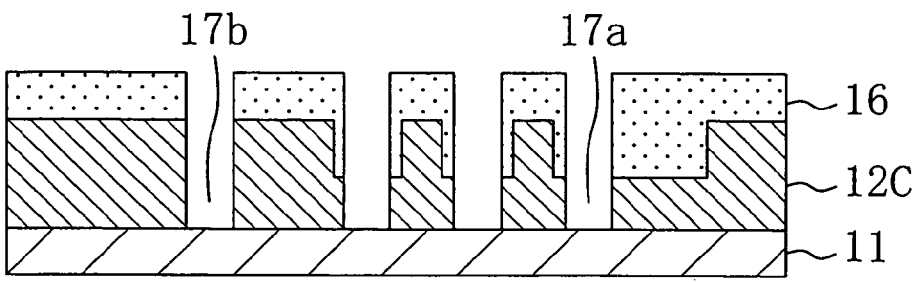

Next, as shown in FIG. 2C, after a resist pattern 16 having a via hole forming opening 16a is formed on the burnt film 12C, the burnt film 12C is dry etched by using the resist pattern 16 as a mask. Thus, as shown in FIG. 2D, second concave portions 17a and 17b corresponding to via holes are formed in the burnt film 12C. In this manner, the second concave portion 17a corresponding to a via hole connected to the first concave portion 15 corresponding to the interconnect groove and the second concave portion 17b corresponding to a via hole not connected to the first concave portion 15 are formed in the burnt film 12C. As an etching gas used in the dry etching, a single gas including fluorine such as a $CF_4$ gas or a $CHF_3$ gas, a mixed gas of a gas including fluorine and an oxygen gas, a mixed gas of a gas including oxygen and a gas including nitrogen, a mixed gas of a gas including nitrogen and a gas including hydrogen, or a single gas such as an ammonia gas may be used.

Figure 3A:
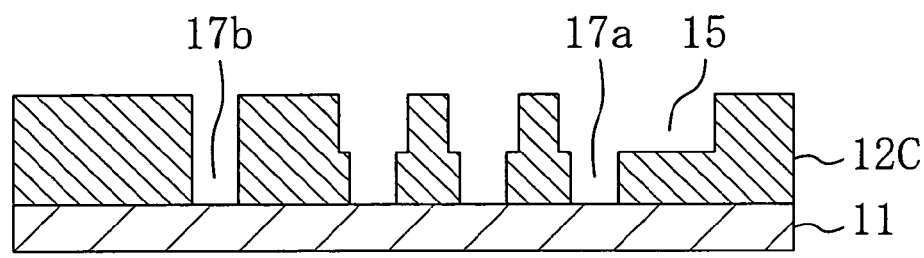
FIGS. 3A through 3C are cross-sectional views for showing other procedures in the method for forming a semiconductor device according to Embodiment 1.
Figure 3B:
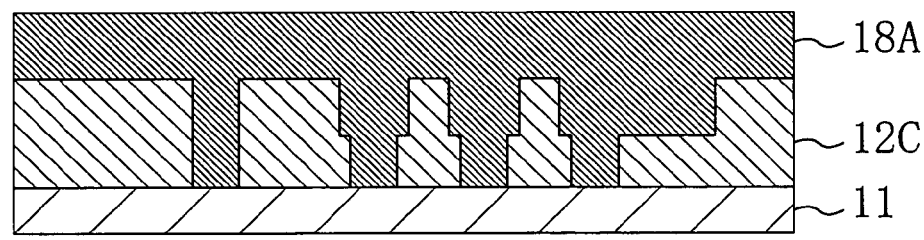
Figure 3C:
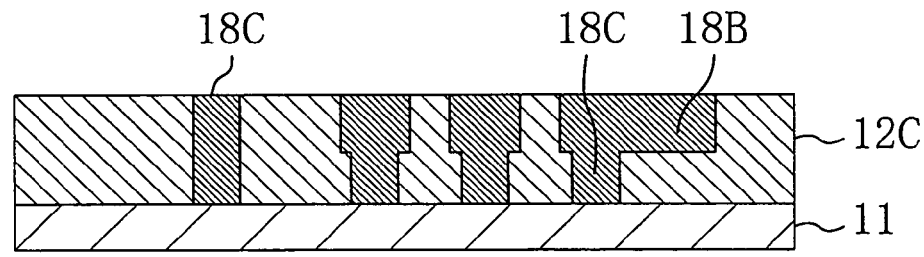

Next, as shown in FIG. 3B, after depositing a barrier metal film of Ta or TaN over the burnt film 12C including the insides of the first concave portion 15 and the second concave portions 17a and 17b by the sputtering method or the CVD, a metal film 18A is deposited over the barrier metal film. In this case, the metal film 18A can be deposited by the plating method on a seed layer formed on the barrier metal film by the sputtering. As the metal film 18A, a metal that can be deposited by the plating method and has low resistance, such as copper, gold, silver or platinum, is preferably used. Also, the metal film 18A may be deposited by the CVD instead of the plating method.

Then, an unnecessary portion of the metal film 18A, namely, a portion thereof exposed above the burnt film 12C, is removed by the CMP. Thus, a metal interconnect 18B and a plug 18C made of the metal film 18A are simultaneously formed in the burnt film 12C corresponding to an insulating film.

Although not shown in the drawings, when the aforementioned procedures are repeated, a multilayered interconnect structure including, in each layer, the interlayer insulating film of the burnt film 12C, the upper metal interconnect 18B and the plug 18C can be formed.

Since the interlayer insulating film made of the burnt film 12C with no global level difference can be formed in Embodiment 1, local concentration of film stress can be released, resulting in improving the reliability of the multilayered interconnects.

Also, in the case where a mask pattern is formed on the interlayer insulating film made of the burnt film 12C by the lithography, degradation of a focal depth margin derived from a level difference can be suppressed. Therefore, as compared with conventional technique, a process margin (process window) can be increased, resulting in forming a highly accurate semiconductor device.

Embodiment 2

A method for forming a semiconductor device according to Embodiment 2 of the invention will now be described with reference to FIGS. 1A through 1D, 2A through 2D and 3A through 3C.

Since the basic process sequence of Embodiment 2 is almost the same as that of Embodiment 1, a difference from that of Embodiment 1 will be principally described below.

First, in the same manner as in Embodiment 1, a flowable film 12A is formed on a substrate 11. Thereafter, a pressing member 13 having a convex portion 14 is pressed against the flowable film 12A, so as to transfer the convex portion 14 onto the flowable film 12A and planarize the whole top face of the flowable film 12A excluding a portion where the convex portion 14 has been transferred.

Next, with the pressing member 13 pressed against the flowable film 12A, the flowable film 12A is annealed at a first temperature (T1), so as to cause a chemical reaction within the flowable film 12A. Thus, the flowable film 12A is solidified, thereby forming a solidified film 12B with a flat top face in which the convex portion 14 has been transferred.

Then, after moving the pressing member 13 away from the solidified film 12B, the solidified film 12B is annealed at a second temperature (T2) higher than the first temperature (T1) for burning the solidified film 12B, thereby forming a burnt film 12C made of the solidified film 12B burnt. Thereafter, the temperature of the burnt film 12C is lowered to approximately room temperature. In this manner, the burnt film 12C having a concave portion 15 formed through the transfer of the convex portion 14 of the pressing member 13 is formed.

A difference between Embodiment 1 and Embodiment 2 is that the solidified film 12B is burnt with the pressing face of the pressing member 13 pressed against the solidified film 12B in Embodiment 1 while it is burnt with the pressing face of the pressing member 13 moved away from the solidified film 12B in Embodiment 2. Accordingly, in Embodiment 2, it is necessary to perform the annealing with a hot plate in the process for solidifying the flowable film 12A but the annealing can be performed with a hot plate or a furnace in the process for burning the solidified film 12B.

Embodiment 2 is more effective than Embodiment 1 in the case where a solidified film largely outgassing is annealed in the burning process. In a general film, the concentration of a remaining solvent in the film can be controlled through the pre-bake, and therefore, the film minimally outgases in the burning process, but depending upon the composition of the film, it may outgas in the burning process where the annealing is performed at a comparatively high temperature. In such a case, there may arise a problem of uniformity or stability of the burnt film 12C when the burning process of Embodiment 1 is performed, and hence, the burning process of Embodiment 2 is preferably performed. In particular, this effect is exhibited when the burnt film 12C is a porous film. In a porous film, most of the basic structure of the film is formed through the annealing performed at the first temperature (T1) in the solidifying process, and a pore forming material added for forming pores is vaporized through the annealing performed at the second temperature (T2) in the burning process. Therefore, the burning process of Embodiment 2 in which the film is burnt with the pressing member 13 moved away from the solidified film 12B is suitable. Even in a porous film, if it is an optimal film in which the basic skeleton of the film is formed and most of a pore forming material is vaporized in the solidifying process, a good burnt film 12C can be obtained even by employing the burning process of Embodiment 1.

In Embodiment 1 or 2, the annealing temperature of the burning process (the second temperature) is set to be higher than the annealing temperature of the solidifying process (the first temperature). In the case where the burnt film 12C is used as an insulating film of a semiconductor device, the annealing temperature of the solidifying process (the first temperature) is preferably approximately 150° C. through 300° C., and the annealing temperature of the burning process (the second temperature) is preferably approximately 350° C. through 450° C.

Next, a difference between a conventional method for forming a semiconductor device and the present method for forming a semiconductor device will be described with reference to FIGS. 4A and 4B.

Figure 4A:
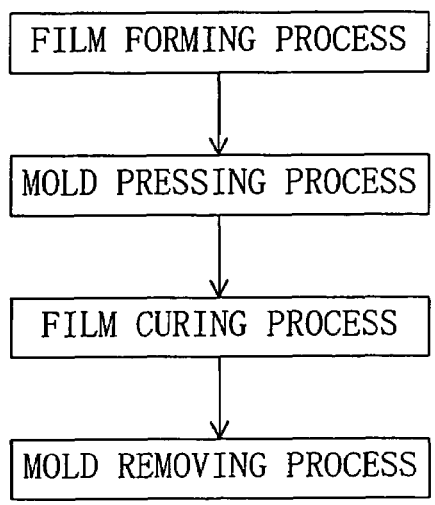
FIG. 4A is a flowchart for showing a sequence of a conventional method for forming a semiconductor device and FIG. 4B is a flowchart for showing a sequence of the method for forming a semiconductor device of Embodiment 1 or 2.
Figure 4B:
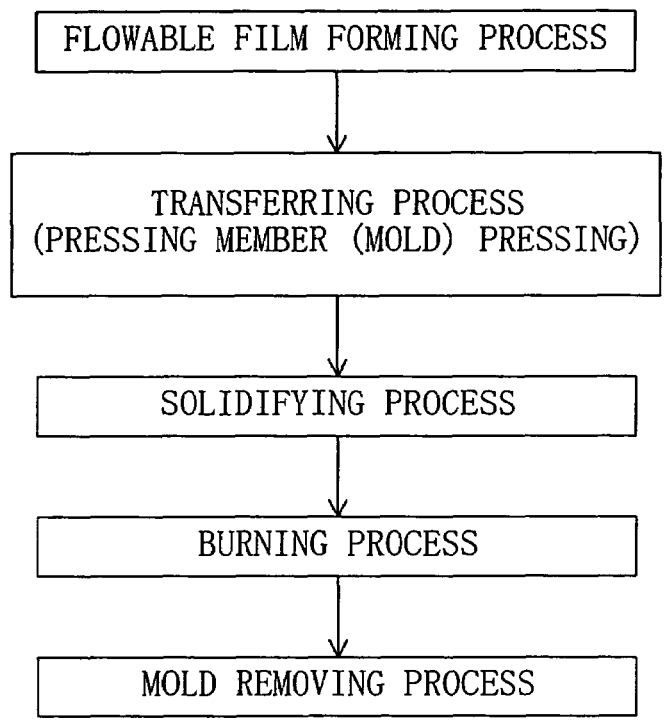

As shown in FIG. 4A, in the conventional method for forming a semiconductor device, a film having a concave portion is formed through one annealing in a film curing process performed after pressing with a pressing member (a mold). On the contrary, as shown in FIG. 4B, in the present method for forming a semiconductor device, after pressing with the pressing member (a mold) (after the transferring process), a burnt film 12C having a concave portion is formed through the annealing performed in the two stages in the solidifying process and the burning process.

EXAMPLE 1

As a method for forming a flowable film used in Embodiment 1 or 2, a first spin coating method will now be described with reference to FIGS. 5A through 5C.

Figure 5A:
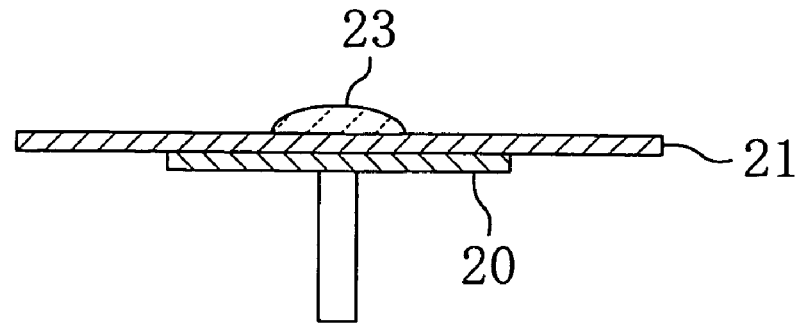
FIGS. 5A through 5C are cross-sectional views for showing procedures in Example 1 employed in the pattern formation method of Embodiment 1 or 2.

First, as shown in FIG. 5A, after holding a substrate 21 through vacuum adsorption on a rotatable stage 20, an appropriate amount of material 23 with flowability is dropped on the substrate 21, and thereafter, the stage 20 is rotated. Alternatively, as shown in FIG. 5B, after holding a substrate 21 through vacuum adsorption on a rotatable stage 20, a material 23 with flowability is supplied from a dropping nozzle 24 onto the substrate 21 while rotating the stage 20 together with the substrate 21.

Figure 5B:
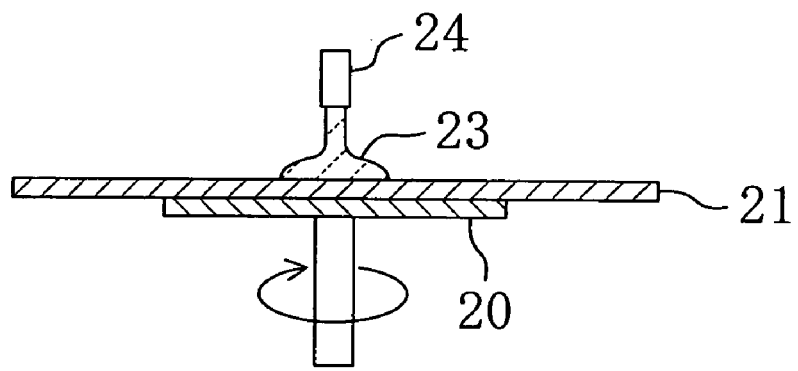
Figure 5C:
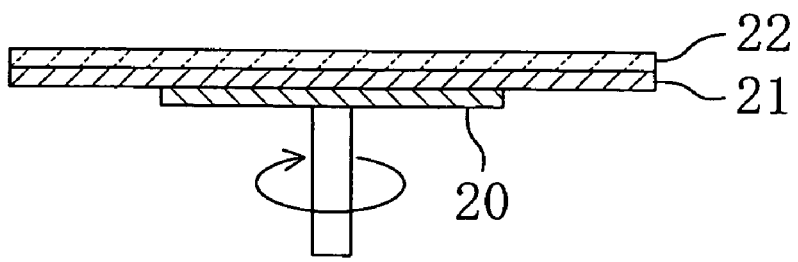

In this manner, a flowable film 22 is formed on the substrate 21 as shown in FIG. 5C.

In either of the method shown in FIG. 5A and the method shown in FIG. 5B, when the viscosity of the material 23 with flowability and the rotation speed of the stage 20 are optimized, the flowable film 22 can attain hardness suitable for the process for transferring the convex portion 14 of the pressing member 13 (see FIG. 1B) onto the flowable film 22.

It is noted that the method of Example 1 is suitable to a case where the flowable film 22 is formed in a comparatively large thickness.

EXAMPLE 2

As a method for forming a flowable film used in Embodiment 1 or 2, a second spin coating method will now be described with reference to FIGS. 6A and 6B.

Figure 6A:
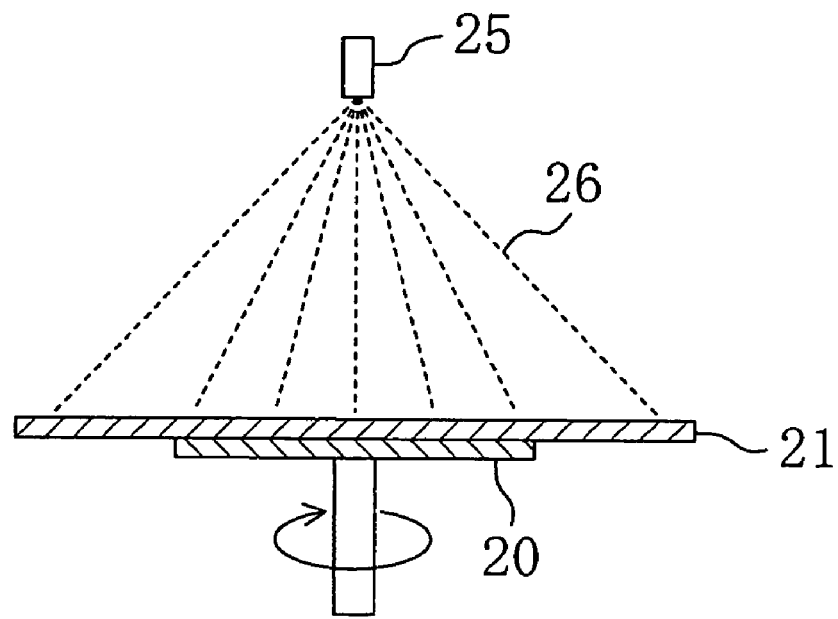
FIGS. 6A and 6B are cross-sectional views for showing procedures in Example 2 employed in the pattern formation method of Embodiment 1 or 2.
Figure 6B:
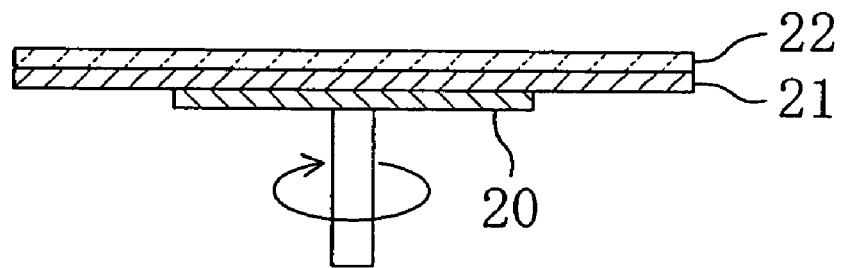

First, as shown in FIG. 6A, after holding a substrate 21 through vacuum adsorption on a rotatable stage 20, a material 26 with flowability is supplied in the form of a shower or spray from a spray nozzle 25 onto the substrate 21 while rotating the stage 20 together with the substrate 21.

After supplying a desired amount of material 26 with flowability, the stage 20 is continuously rotated for a predetermined period of time. Thus, a flowable film 22 is formed on the substrate 21 as shown in FIG. 6B.

The method of Example 2 is suitable to a case where the flowable film 22 is formed in a comparatively small thickness.

EXAMPLE 3

As a method for forming the flowable film used in Embodiment 1 or 2, a microscopic spraying method will now be described with reference to FIGS. 7A and 7B.

Figure 7A:
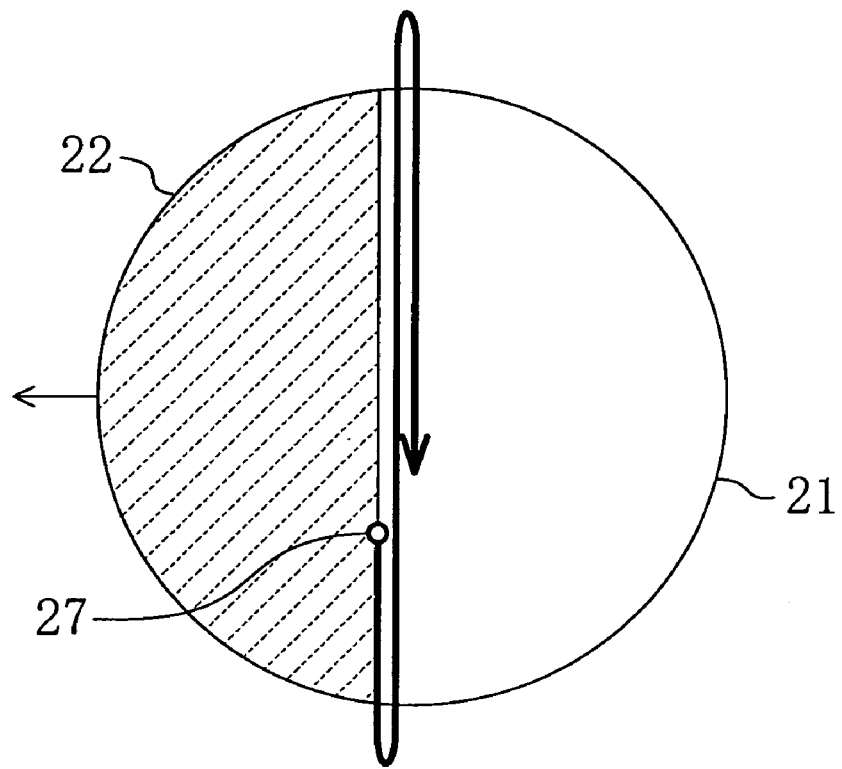
FIGS. 7A and 7B are cross-sectional views for showing procedures in Example 3 employed in the pattern formation method of Embodiment 1 or 2.

First, as shown in FIG. 7A, a material 28 with flowability is supplied from a dropping nozzle 27 onto a substrate 21 by a given amount at a time while moving the substrate 21 along one of the two perpendicular directions of the two-dimensional rectangular coordinate system, for example, along the lateral direction of FIG. 7A and moving the dropping nozzle 27 along the other of the two perpendicular directions, for example, along the longitudinal direction of FIG. 7A. In other words, an operation for moving the substrate 21 by a given distance toward the leftward direction in FIG. 7A and stopping it is repeatedly performed, and while the substrate 21 is stopped, the material 28 with flowability is supplied from the dropping nozzle 27 onto the substrate 21 by a given amount at a time while moving the dropping nozzle 27 along the longitudinal direction in FIG. 7A.

Figure 7B:
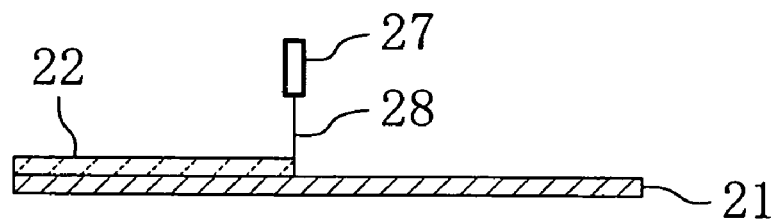

In this manner, a flowable film 22 is formed on the substrate 21 as shown in FIG. 7B.

In the method of Example 3, the thickness of the flowable film 22 can be controlled over a range from a small thickness to a large thickness by adjusting the amount of material 28 with flowability supplied from the dropping nozzle 27 and the moving rate of the dropping nozzle 27.

Also, the degree of the flowability of the flowable film 22 can be changed by adjusting the viscosity of the material 28 with flowability supplied from the dropping nozzle 27.

Furthermore, the process speed can be controlled by adjusting the number of dropping nozzles 27.

EXAMPLE 4

As a method for forming a flowable film used in Embodiment 1 or 2, a rotation roller method will now be described with reference to FIGS. 8A and 8B.

Figure 8A:
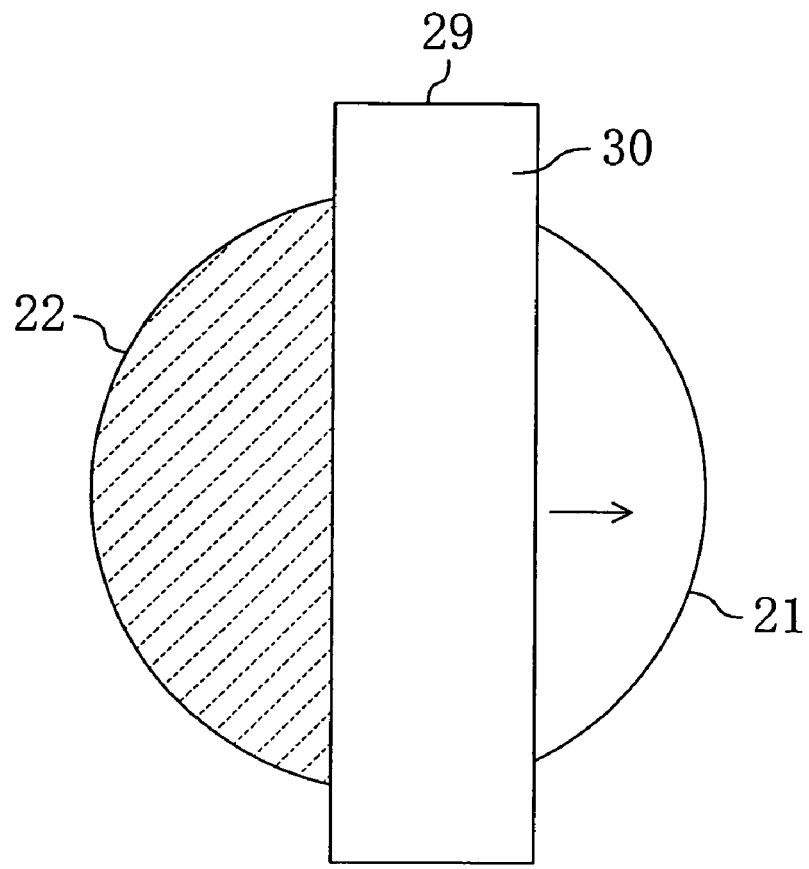
FIGS. 8A and 8B are cross-sectional views for showing procedures in Example 4 employed in the pattern formation method of Embodiment 1 or 2.
Figure 8B:
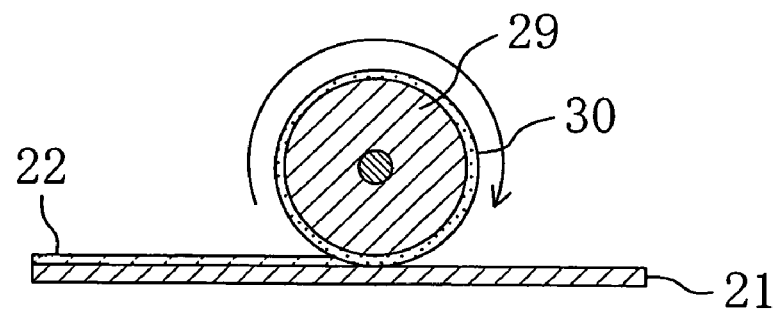

As shown in FIGS. 8A and 8B, with a material 30 with flowability uniformly adhered onto the peripheral face of a rotation roller 29, the rotation roller 29 is rotationally moved on the surface of a substrate 21.

In this manner, the material 30 with flowability is adhered onto the surface of the substrate 21, and hence, a flowable film 22 is formed on the substrate 21 as shown in FIG. 8B.

In the method of Example 4, the thickness of the flowable film 22 can be controlled by adjusting the distance between the rotation roller 29 and the substrate 21 and a force for pressing the rotation roller 29 against the substrate 21.

Also, the method of Example 4 is suitable to a case where the material 30 with flowability is in the form of a highly viscous liquid or a gel.

Embodiment 3

A method for forming a semiconductor device according to Embodiment 3 will now be described with reference to FIGS. 9A through 9C and 10A through 10C.

In Embodiment 3, methods for selectively removing a peripheral portion of the flowable film obtained in Embodiment 1 or 2 are described. Specifically, in a first method, the peripheral portion is removed by supplying a solution for dissolving the flowable film to the peripheral portion of the flowable film while rotating the substrate on which the flowable film is formed, and in a second method, the peripheral portion of the flowable film is modified by irradiating the peripheral portion with light and thereafter the modified peripheral portion is removed.

In Embodiment 1 or 2, the flowable film is formed over the whole surface of the substrate, namely, also on a peripheral portion of the substrate. However, it is sometimes necessary to mechanically hold the peripheral portion of the substrate.

Embodiment 3 is devised for overcoming such a problem, and since the peripheral portion of the flowable film is selectively removed in Embodiment 3, the peripheral portion of the substrate can be easily mechanically held.

Now, the first method for selectively removing the peripheral portion of a flowable film 22 will be described with reference to FIGS. 9A through 9C.

Figure 9A:
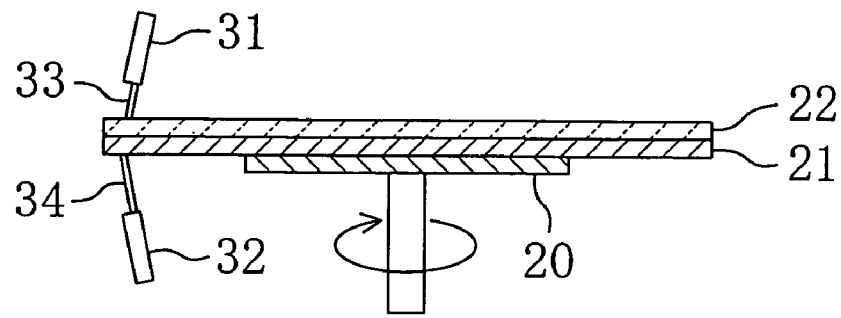
FIGS. 9A through 9C are cross-sectional views for showing procedures in a pattern formation method according to Embodiment 3.

First, as shown in FIG. 9A, after a substrate 21 on which the flowable film 22 is formed is held through vacuum adsorption on a rotatable stage 20, the stage 20 is rotated for rotating the flowable film 22, a release solution 33 is supplied from a first nozzle 31 to the peripheral portion of the flowable film 22 and a release solution 34 is supplied from a second nozzle 32 to the back surface of the peripheral portion of the substrate 21.

Figure 9B:
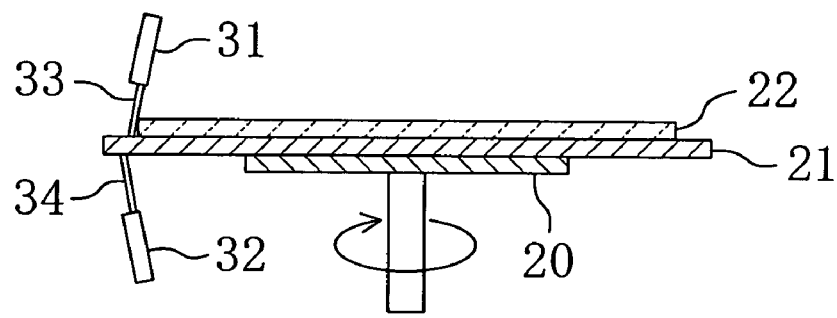
Figure 9C:
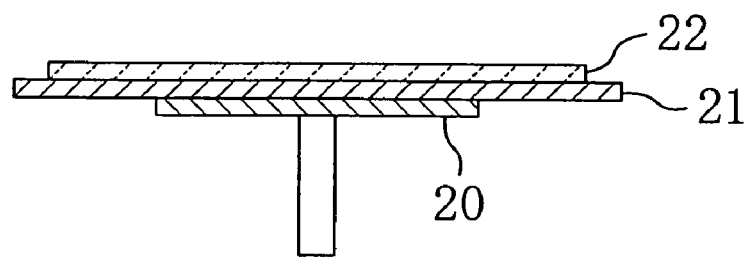

Thus, as shown in FIG. 9B, the peripheral portion of the flowable film 22 can be removed as well as the material with flowability having been adhered onto the peripheral portion of the back surface of the substrate 21 can be removed.

Next, while continuously rotating the stage 20, the supply of the release solutions 33 and 34 is stopped, so as to dry the flowable film 22. In this manner, as shown in FIG. 9C, the flowable film 22 whose peripheral portion has been selectively removed can be obtained.

It is noted that the first method is preferably performed before the transferring process for the flowable film 22.

Since the peripheral portion of the flowable film 22 is removed while rotating the stage 20 together with the flowable film 22 in the first method, this method is suitable when the plane shape of the substrate 21 is in the shape of a circle or a polygon with a large number of vertexes.

Now, the second method for selectively removing the peripheral portion of a flowable film 22 will be described with reference to FIGS. 10A through 10C.

Figure 10A:
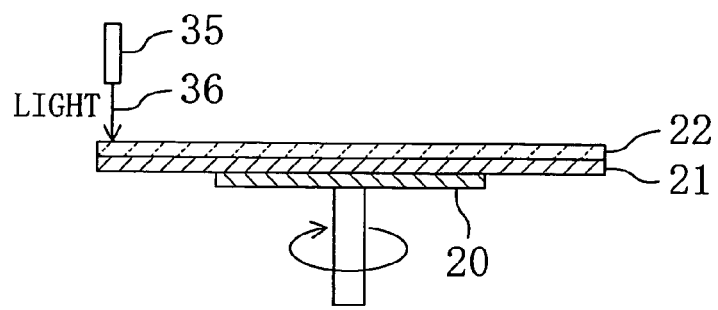
FIGS. 10A through 10C are cross-sectional views for showing other procedures in the pattern formation method of Embodiment 3.

First, as shown in FIG. 10A, after a substrate 21 on which the flowable film 22 is formed is held through vacuum adsorption on a rotatable stage 20, the stage 20 is rotated for rotating the flowable film 22, and the peripheral portion of the flowable film 22 is irradiated with light 36 emitted from a photoirradiation device 35, so as to modify the peripheral portion by causing a photochemical reaction in the peripheral portion (irradiated portion) of the flowable film 22. The light 36 used in this case is preferably UV or light of a shorter wavelength than UV.

Figure 10B:
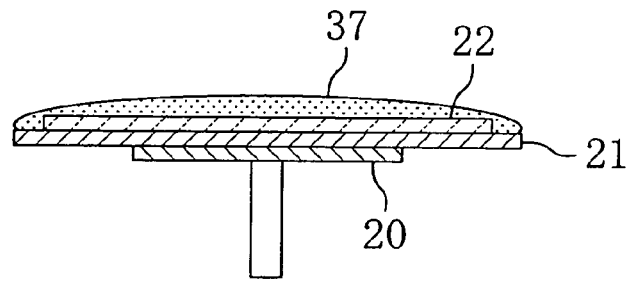

Next, as shown in FIG. 10B, after stopping the rotation of the stage 20 together with the flowable film 22, a solution 37 such as a developer is supplied over the flowable film 22. Thus, the peripheral portion of the flowable film 22 having been modified is dissolved in the solution 37, and hence, the peripheral portion of the flowable film 22 can be selectively removed.

Figure 10C:
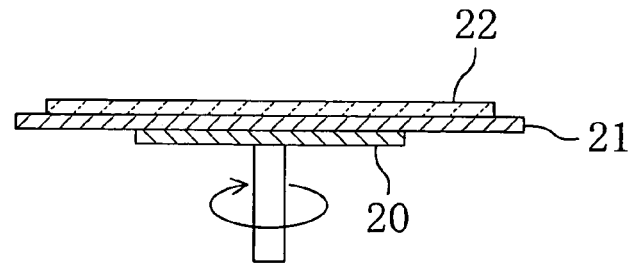

Then, as shown in FIG. 10C, the stage 20 is rotated together with the flowable film 22 again, so as to remove the solution 37 remaining on the flowable film 22 to the outside by using centrifugal force. In this case, while or after removing the solution 37, a rinsing solution is preferably supplied onto the flowable film 22 so as to remove the solution 37 still remaining. In this manner, the flowable film 22 whose peripheral portion has been selectively removed can be obtained.

It is noted that the second method is preferably performed before the transferring process for the flowable film 22. Since the peripheral portion of the flowable film 22 is selectively irradiated with the light 36 in the second method, this method is applicable not only when the plane shape of the substrate 21 is in the shape of a circle or a polygon with a large number of vertexes but also when it is in the shape of a polygon with a small number of vertexes such as a triangle or a rectangle.

Embodiment 4

A method for forming a semiconductor device according to Embodiment 4 of the invention will now be described with reference to FIGS. 11A, 11B, 12A and 12B.

In Embodiment 4, a preferable method for transferring the convex portion of the pressing member onto the flowable film obtained in Embodiment 1 or 2 is described, and in this method, a plurality of distances between the surface of the substrate or the stage and the pressing face of the pressing member are measured and the flowable film is pressed in such a manner that these plural distances are equal to one another.

Figure 11A:
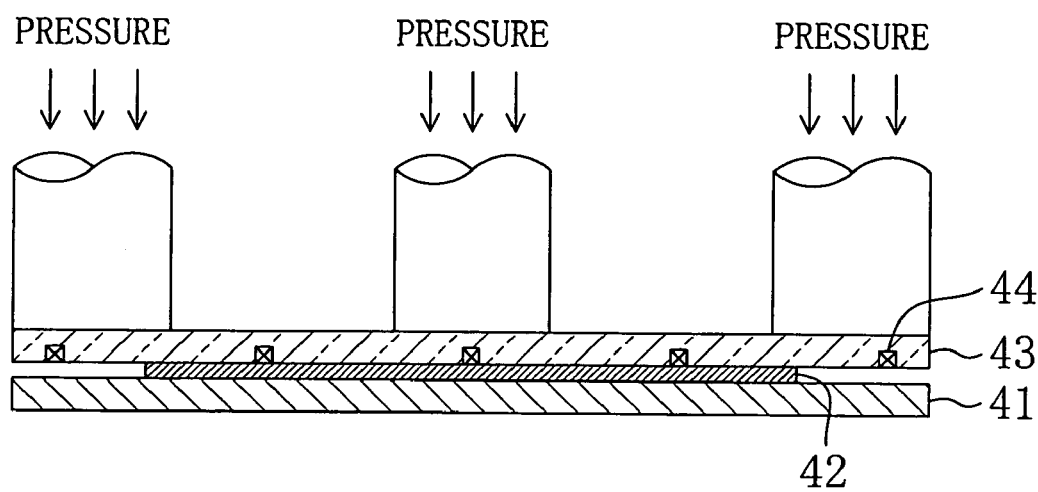
FIGS. 11A and 11B are cross-sectional views for showing procedures in a pattern formation method according to Embodiment 4.

First, as shown in FIG. 11A, after forming a flowable film 42 on a substrate 41 by the method of Embodiment 1 or 2, a pressing member 43 having a convex portion and a plurality of distance sensors 44 on its pressing face is used for transferring the convex portion of the pressing member 43 onto the flowable film 42. In Embodiment 4, the outside dimension of the stage 20 (see FIG. 5C or 6B) is preferably larger than that of the substrate 41.

In this case, a plurality of distances between the surface of the substrate 41 or the surface of the stage 20 (see FIG. 5C or 6B) on which the substrate 41 is placed and the pressing face of the pressing member 43 are measured with the plural distance sensors 44, and the convex portion of the pressing member 43 are transferred onto the flowable film 42 by pressing the flowable film 42 with the pressing member 43 in such a manner that the plural distances are equal to one another. Specifically, information of the plural distances measured with the plural distance sensors 44 is fed back to pressing means for pressing the pressing member 43, so that the flowable film 42 can be pressed in such a manner that the plural distances are equal to one another. The feedback control may be executed by using a computer. Also, in measuring the plural distances between the surface of the substrate 41 or the surface of the stage 20 (see FIG. 5C or 6B) on which the substrate 41 is placed and the pressing face of the pressing member 43, each distance is preferably measured by measuring capacitance per unit area in the corresponding measurement position. Thus, the plural distances can be easily and definitely measured.

Now, the method for measuring the plural distances between the surface of the substrate 41 and the pressing face of the pressing member 43 will be described with reference to FIG. 11B.

Figure 11B:
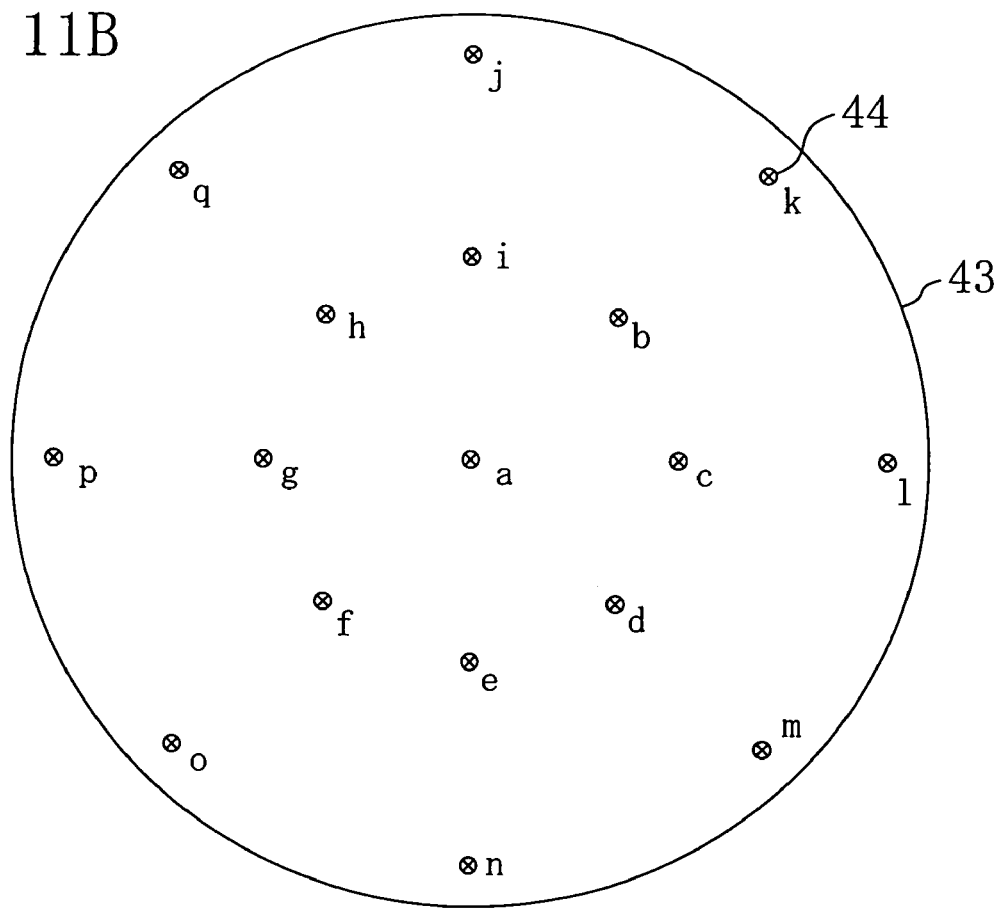

In FIG. 11B, a, b, c, . . . and q denote positions where the distance sensors 44 are respectively provided. The positions a through q are preferably optimized in accordance with the mechanism of the pressing member 43 so as to be set to positions where the distances between the surface of the substrate 41 or the surface of the stage where the substrate 41 is placed and the surface of the flowable film 42 can be efficiently measured. For example, the sensor positions a through i at the center are suitable to measure the distances between the surface of the substrate 41 and the surface of the flowable film 42, and the sensor positions j through q in the peripheral portion are suitable to measure the distances between the surface of the stage where the substrate 41 is placed and the surface of the flowable film 42.

Accordingly, merely the distances between the surface of the substrate 41 and the surface of the flowable film 42 may be measured with the distance sensors 44 provided in the sensor positions a through i alone, merely the distances between the surface of the stage where the substrate 41 is placed and the surface of the flowable film 42 may be measured with the distance sensors 44 provided in the sensor positions j through q alone, or the distances between the surface of the substrate 41 and the surface of the flowable film 42 and the distances between the surface of the stage where the substrate 41 is placed and the surface of the flowable film 42 may be measured with the distance sensors 44 provided in the sensor positions a through q.

Alternatively, in the case where the convex portion of the pressing face of the pressing member 44 can be finely adjusted, after the distances between the surface of the substrate 41 and the surface of the flowable film 42 are adjusted with the distance sensors 44 provided in the sensor positions a through i, the distances between the surface of the substrate 41 and the surface of the flowable film 42 may be adjusted with the distance sensors 44 provided in the sensor positions j through q. Thus, more highly accurate flatness can be realized. It is noted that the number and the positions of the distance sensors 44 may be optimized in accordance with a desired degree of flatness.

In Embodiment 1, it is significant but is not easy to equalize a distance of the surface of the flowable film 12A from the surface of the substrate 11. In other words, in Embodiment 1, the distance of the surface of the flowable film 12A from the surface of the substrate 11 can be made uniform by previously setting the distance between the surface of the substrate 11 and the pressing face of the pressing member 13 to be uniform. However, in this method, it is necessary to set the distance between the surface of the substrate 11 and the pressing face of the pressing member 13 to be uniform every given period of time, namely, every time the pressing face of the pressing member 13 has pressed a given number of flowable films 12A.

However, in Embodiment 4, the distance of the surface of the flowable film 42 from the surface of the substrate 41 can be always uniform, and hence, an operation for making the distance between the surface of the substrate 41 and the pressing face of the pressing member 43 uniform every given period of time can be omitted.

The process for adjusting the distance between the surface of the substrate 41 and the pressing face of the pressing member 43 to be uniform may be performed before, while or after pressing the flowable film 42 with the pressing member 43.

Figure 12A:
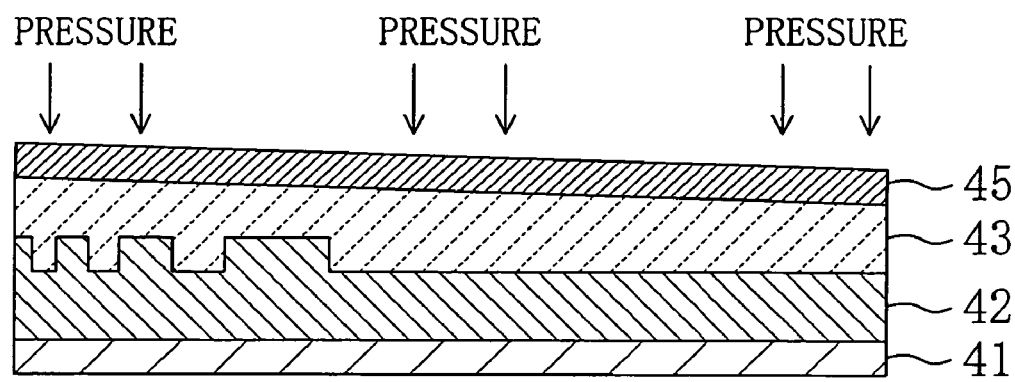
FIGS. 12A and 12B are cross-sectional views for showing other procedures in the pattern formation method of Embodiment 4.
Figure 12B:
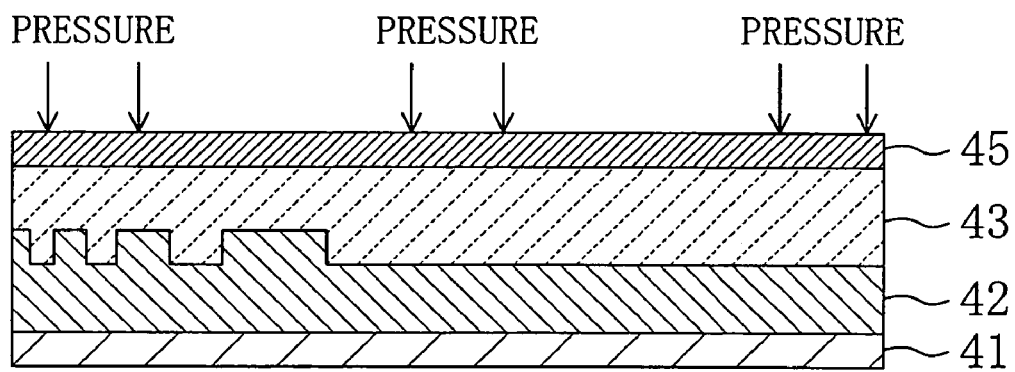

FIG. 12A shows a cross-section of the flowable film 42 obtained when the distance between the pressing face of the pressing member 43 and the surface of the substrate 41 is ununiform, and FIG. 12B shows a cross-section of the flowable film 42 obtained when the distance between the pressing face of the pressing member 43 and the surface of the substrate 41 is kept uniform. In FIGS. 12A and 12B, a reference numeral 45 denotes a pressure plate for applying a pressure to the pressing member 43.

As is understood from comparison between FIGS. 12A and 12B, when the flowable film 42 is pressed with the distance between the pressing face of the pressing member 43 and the surface of the substrate 11 kept uniform, the top face of the flowable film 42 can be planarized with the distance of the flowable film 42 from the surface of the substrate 41 kept uniform.

Embodiment 5

A pattern formation method according to Embodiment 5 will now be described with reference to FIGS. 13A and 13B.

In the method of Embodiment 5, a flowable film 52A is solidified by annealing the flowable film 52A while irradiating it with light.

Figure 13A:
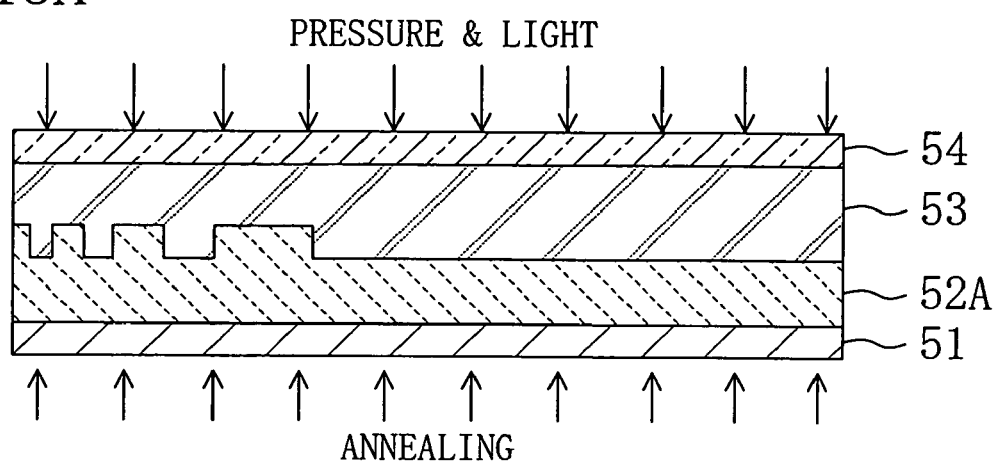
FIGS. 13A and 13B are cross-sectional views for showing procedures in a pattern formation method according to Embodiment 5.

As shown in FIG. 13A, while pressing, with a pressure plate 54, a pressing face of a pressing member 53, which is made of a light transmitting material such as quartz and has a convex portion on its pressing face, against the flowable film 52A formed on a substrate 51, so as to transfer the convex portion of the pressing member 53 onto the flowable film 52A, the flowable film 52A is irradiated with light and annealed. The light used for the irradiation is, when the flowable film 52A is solidified principally through a photochemical reaction, preferably UV or light of a shorter wavelength than UV, and when the flowable film 52A is solidified principally through a thermal chemical reaction, preferably infrared light.

Figure 13B:
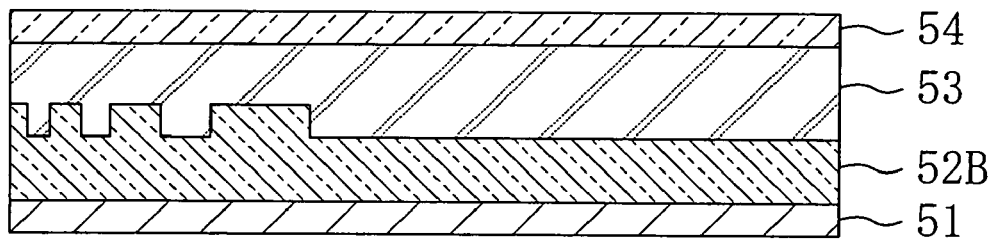

Thus, the flowable film 52A is solidified through the photochemical reaction or the thermal chemical reaction, resulting in giving a solidified film 52B as shown in FIG. 13B.

The method for solidifying the flowable film 52A principally through the photochemical reaction is suitable to a film of a photo-setting resin, such as a photosensitive resin film like a photoresist used in the lithography. Also, the method for solidifying the flowable film 52A principally through the thermal chemical reaction is suitable to an organic film, an organic-inorganic film or an inorganic film made of a chemically amplified material composed of a material for generating an acid or a base through irradiation with light and a base polymer solidified by an acid or a base.

Embodiment 6

A method for forming a semiconductor device according to Embodiment 6 will now be described with reference to FIGS. 14A through 14D, 15A through 15D and 16A through 16C.

Figure 14A:
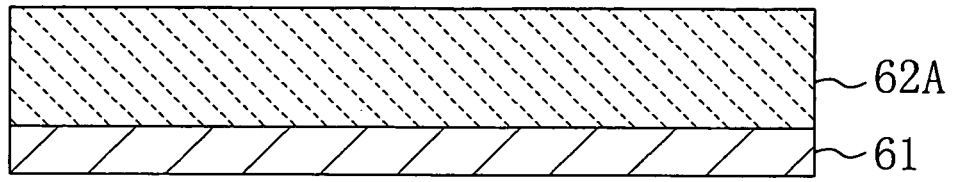
FIGS. 14A through 14D are cross-sectional views for showing procedures in a method for forming a semiconductor device according to Embodiment 6.

First as shown in FIG. 14A, after forming an interlayer insulating film on a semiconductor substrate, a lower buried interconnect is formed in an upper portion of the interlayer insulating film, and then, a diffusion preventing film is formed on the lower buried interconnect and the interlayer insulating film. Thus, a substrate 61 having the interlayer insulating film, the lower buried interconnect and the diffusion preventing film formed on the semiconductor substrate is obtained. In this case, the shape of the substrate 61 is not particularly specified and may be any shape including a circle, a polygon and the like, and is not limited to a plane shape. The diffusion preventing film has a function to prevent a metal included in the lower buried interconnect from diffusing into an insulating film to be formed on the buried interconnect.

Next, an insulating material with flowability, such as an insulating material in the form of a liquid or a gel, is supplied over the substrate 61, so as to form a film with flowability (hereinafter simply referred to as the flowable film) 62A. The flowable film 62A may be an organic film, an inorganic film, an organic-inorganic film (organic-inorganic hybrid film), a photo-setting resin film that is cured through irradiation with light, a porous film having a large number of pores with a diameter of approximately 1 nm through 10 nm therein, or the like as in Embodiment 1. Also, the method for forming the flowable film 62A may be the spin coating method, the microscopic spraying method, the rotation roller method or the like, the thickness of the flowable film 62A is adjusted differently depending upon the employed method, and the film thickness can be adjusted by selecting the method for forming the flowable film 62A. Specifically, any of the methods described in Examples 1 through 4 of Embodiment 1 can be used as the method for forming the flowable film 62A.

In general, annealing is performed at approximately 80° C. through 120° C. in order to vaporize a part or most of a solvent included in the flowable film 62A formed on the substrate 61. This annealing is generally designated as pre-bake, and the temperature of the pre-bake may be set so that the flowability of the flowable film 62A can be kept in a transferring process subsequently performed. Specifically, the temperature may be set in accordance with the characteristics (such as the boiling point) of the solvent used for supplying the material with flowability, and the pre-bake may be omitted in some cases.

The plane shape of the substrate 61 is not particularly specified, and may be any shape including a circle, a polygon and the like.

Figure 14B:
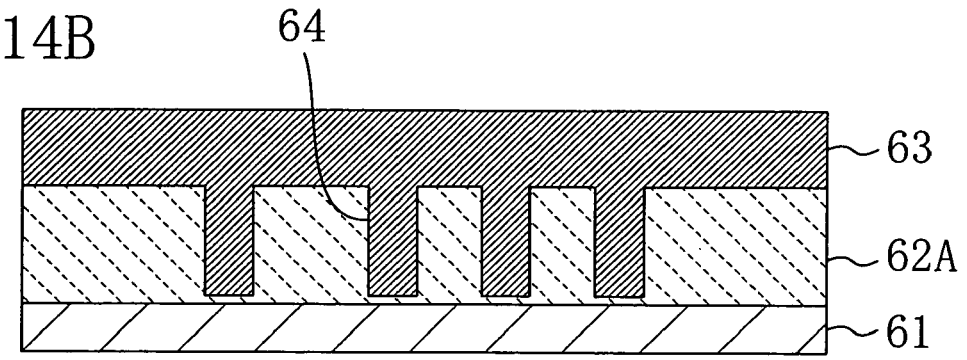
Figure 14C:
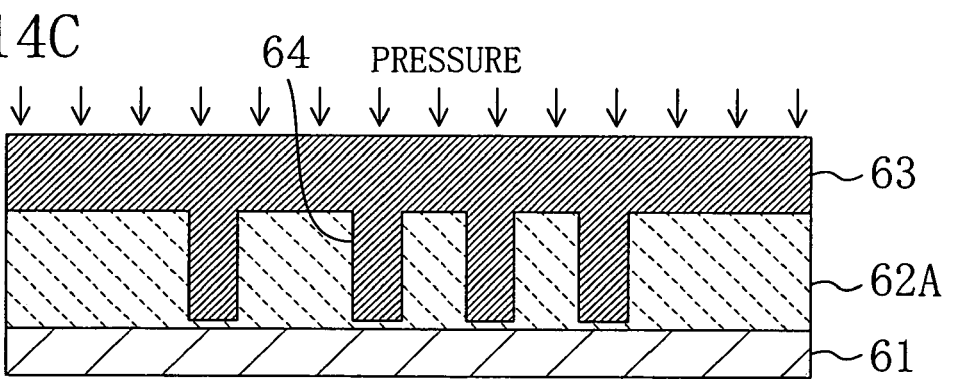

Next, as shown in FIG. 14B, after a flat pressing face of a pressing member 63 having convex portions 64 in the shape of dots on the pressing face is opposed to the surface of the flowable film 62A, as shown in FIG. 14C, a pressure toward the substrate is applied to the pressing member 63 so as to transfer the convex portions 64 onto the surface of the flowable film 62A and to planarize the top face of the flowable film 62A excluding concave portions formed through the transfer of the convex portions 64.

In this case, merely by pressing the flowable film 62A with the pressing face of the pressing member 63, the whole top face of the flowable film 62A excluding the portion where the convex portions have been transferred is planarized. However, when the press with the pressing member 63 is intermitted, the flowable film 62A is changed into an energetically stable shape owing to the surface tension of the flowable film 62A.

Figure 14D:
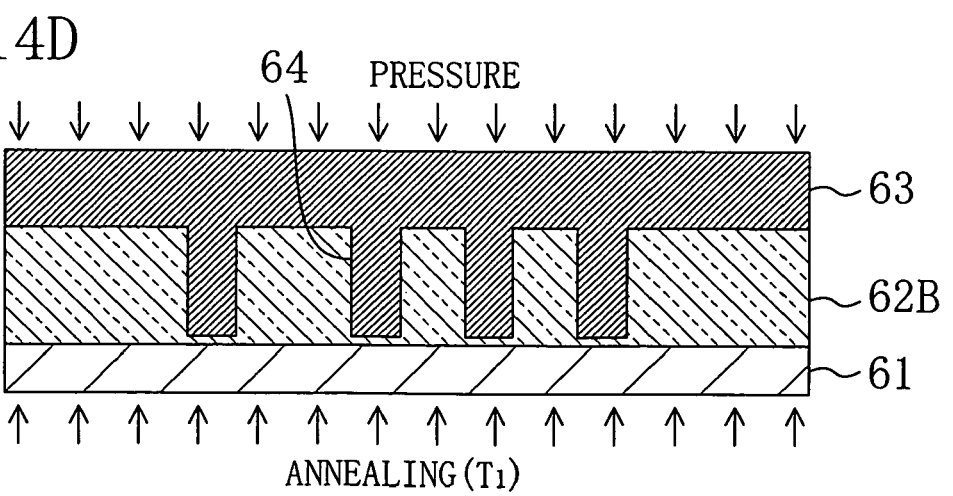

Therefore, as shown in FIG. 14D, with the pressing member 63 pressed against the flowable film 62A, the flowable film 62A is annealed at a first temperature (T1) so as to cause a thermal chemical reaction within the flowable film 62A. Thus, the flowable film 62A is solidified to form a solidified film 62B that is made of the flowable film 62A solidified and has first concave portions in the shape of holes formed through the transfer of the convex portions 64. The first temperature (T1) is preferably approximately 150° C. through approximately 300° C. and is more preferably approximately 200° C. through approximately 250° C. In this manner, the basic skeleton of the flowable film 62A, such as a polymer skeleton or a siloxane skeleton, is definitely formed. In the solidifying process, the annealing is performed with a hot plate set to a desired temperature for approximately 2 through 3 minutes.

Figure 15A:
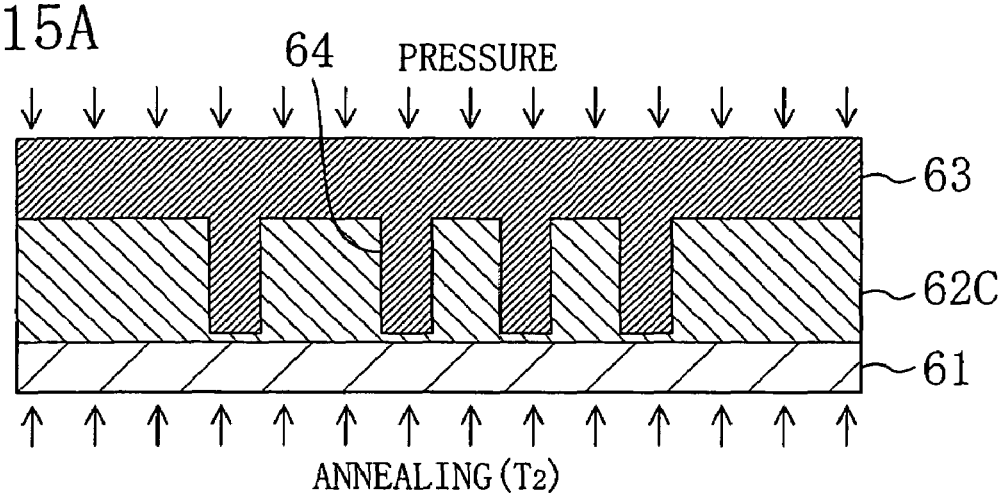
FIGS. 15A through 15D are cross-sectional views for showing other procedures in the method for forming a semiconductor device of Embodiment 6.

Next, as shown in FIG. 15A, with the pressing member 63 pressed against the solidified film 62B, the solidified film 62B is annealed at a second temperature (T2) higher than the first temperature (T1) for burning the solidified film 62B. Thus, a burnt film 62C made of the solidified film 62B burnt and having first concave portions 65 corresponding to via holes is formed. The second temperature (T2) is preferably approximately 350° C. through approximately 450° C. In this manner, porogen or the like is vaporized from the solidified film 62B where the basic skeleton has been formed, and hence, the burnt film 62C with a uniform film quality can be obtained. In the burning process, the annealing is performed with a hot plate set to a desired temperature for approximately 2 through approximately 15 minutes.

Figure 15B:
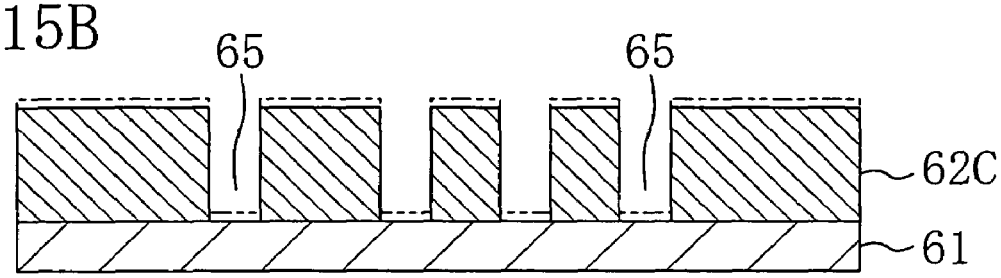

Next, after lowering the temperature of the burnt film 62C to a temperature range between approximately 100° C. and room temperature, the pressing member 63 is moved away from the burnt film 62C as shown in FIG. 15B. Thereafter, the temperature of the burnt film 62C is ultimately lowered to room temperature, and then, the burnt film 62C is subjected to an etch back process using anisotropic dry etching. Thus, a portion of the burnt film 62C remaining on the bottoms of the first concave portions 65 is removed through the etch back, and hence, the burnt film 62C that has first concave portions 65 corresponding to interconnect grooves and is flat in the whole top face excluding the concave portions 65 is obtained. Thereafter, although not shown in the drawings, the diffusion preventing film formed on the lower metal interconnect is removed by the anisotropic dry etching, so as to expose the lower metal interconnect. It is noted that the anisotropic dry etching of the etch back process and the anisotropic dry etching of the diffusion preventing film may be simultaneously performed depending upon their etching conditions.

Figure 15C:
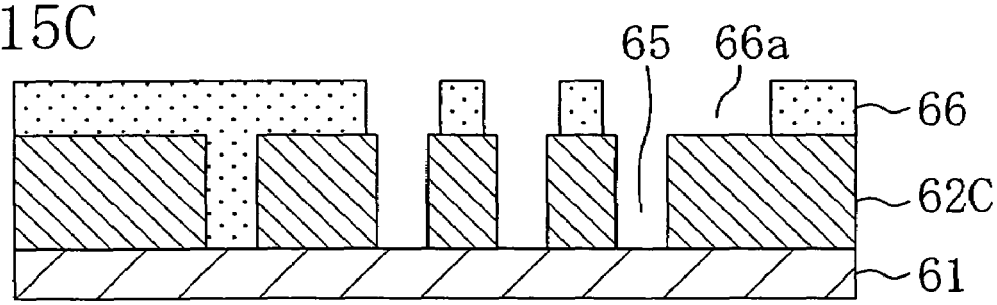
Figure 15D:
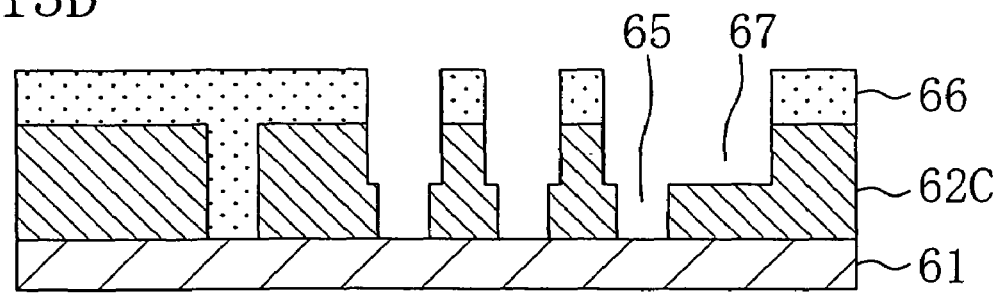
Figure 16A:
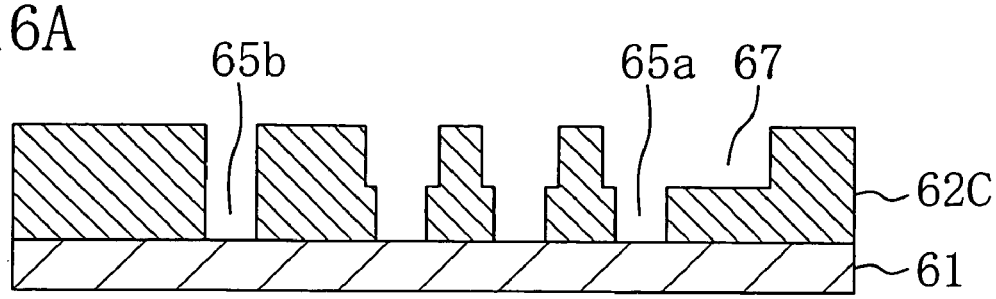
FIGS. 16A through 16C are cross-sectional views for showing other procedures in the method for forming a semiconductor device according to Embodiment 6.

Next, as shown in FIG. 15C, after a resist pattern 66 having an interconnect groove forming opening 66a is formed on the burnt film 62C, the burnt film 62C is dry etched by using the resist pattern 66 as a mask. Thus, as shown in FIG. 16A, a second concave portion 67 corresponding to an interconnect groove is formed in the burnt film 62C. In this manner, the second concave portion 67 corresponding to an interconnect groove connected to a first concave portion 65a corresponding to a via hole is formed in the burnt film 62C, and a first concave portion 65b corresponding to a via hole not connected to the second concave portion 67 corresponding to the interconnect groove is exposed. As an etching gas used in the dry etching, a single gas including fluorine such as a $CF_4$ gas or a $CHF_3$ gas, a mixed gas of a gas including fluorine and an oxygen gas, a mixed gas of a gas including oxygen and a gas including nitrogen, a mixed gas of a gas including nitrogen and a gas including hydrogen, or a single gas such as an ammonia gas may be used.

Figure 16B:
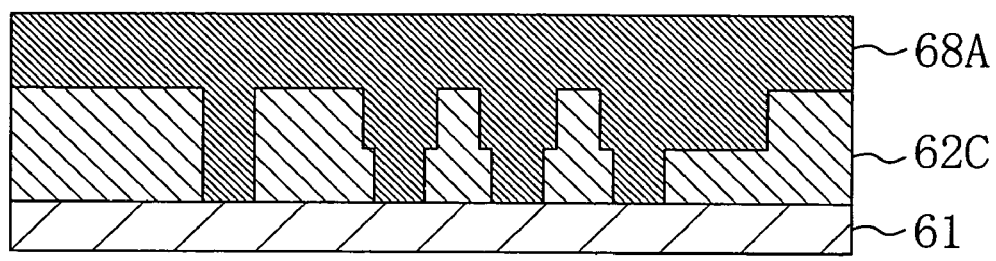
Figure 16C:
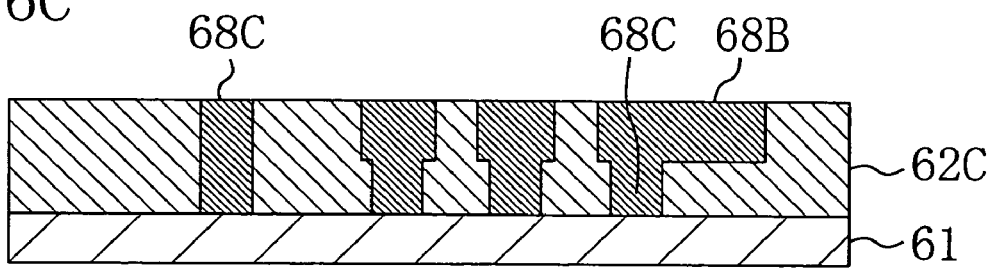
Figure 17A:
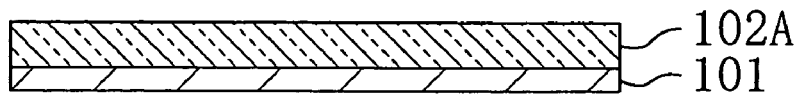
FIGS. 17A through 17E are cross-sectional views for showing procedures in a pattern formation method according to a first conventional example.
Figure 17B:
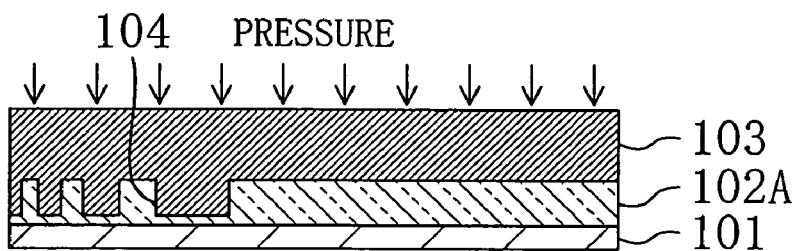
Figure 17C:
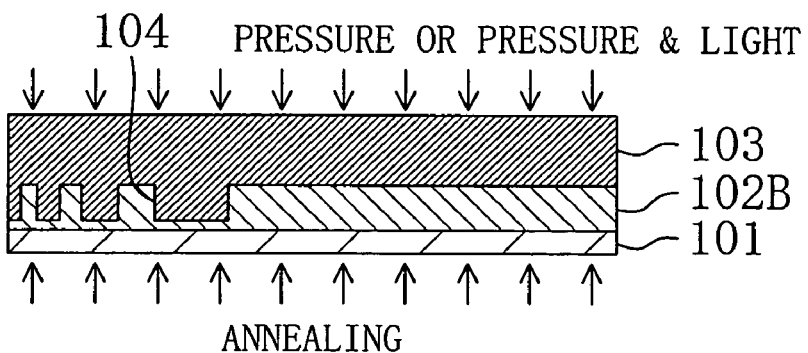
Figure 17D:
Figure 17E:
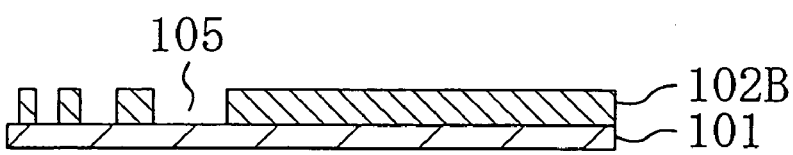
Figure 18A:
FIGS. 18A through 18E are cross-sectional views for showing procedures in a method for forming a semiconductor device according to a second conventional example.
Figure 18B:
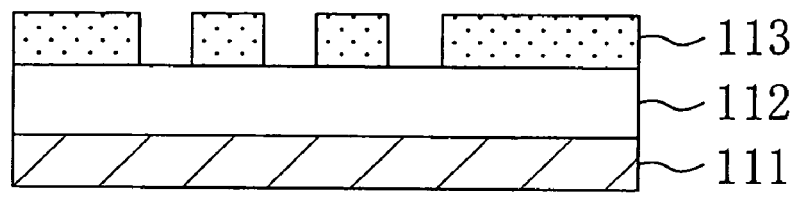
Figure 18C:
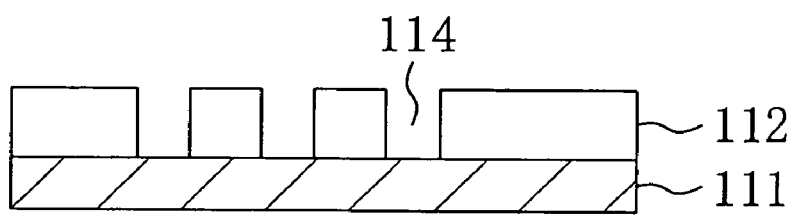
Figure 18D:
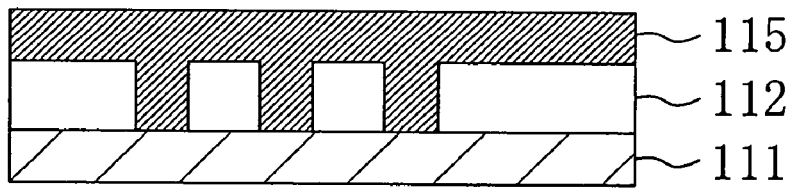
Figure 18E:
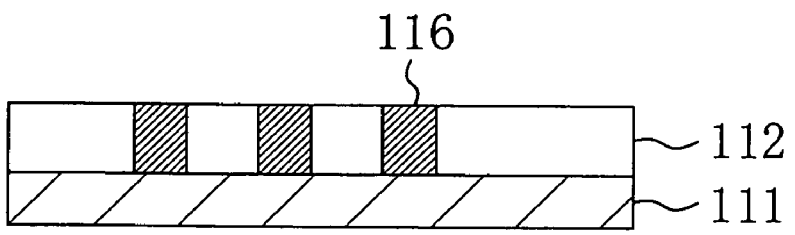
Figure 19A:
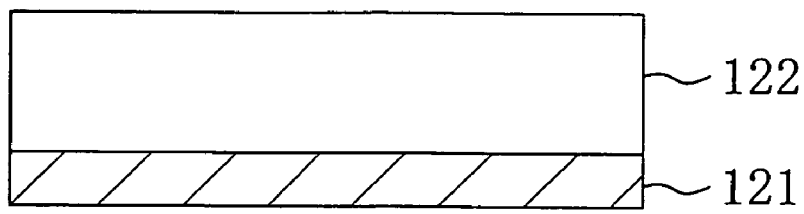
FIGS. 19A through 19D are cross-sectional views for showing procedures in a method for forming a semiconductor device according to a third conventional example.
Figure 19B:
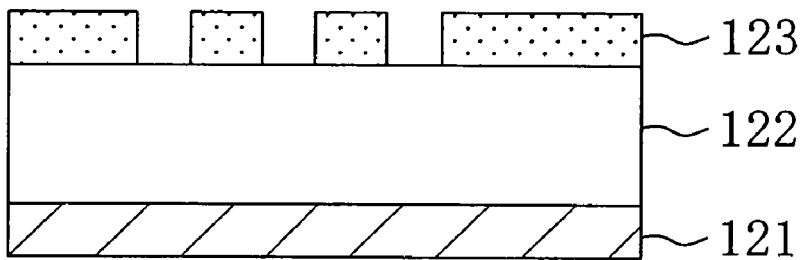
Figure 19C:
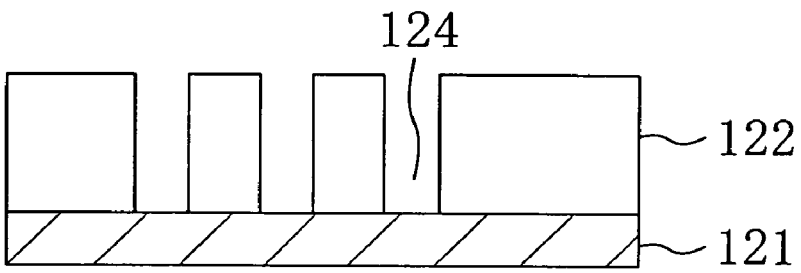
Figure 19D:
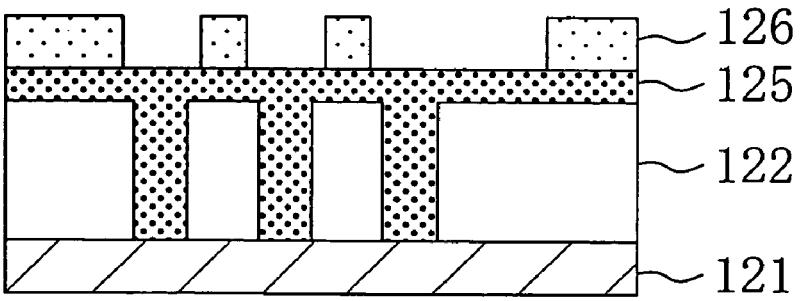
Figure 20A:
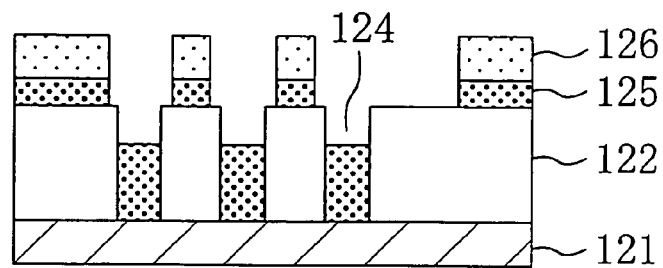
FIGS. 20A through 20D are cross-sectional views for showing other procedures in the method for forming a semiconductor device of the third conventional example.
Figure 20B:
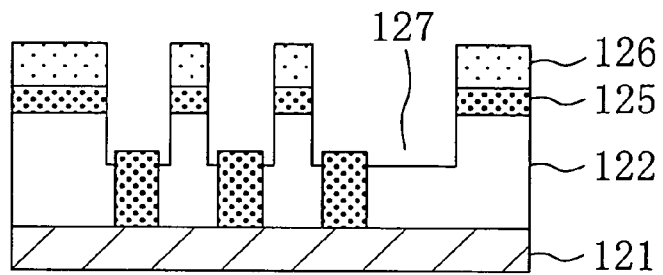
Figure 20C:
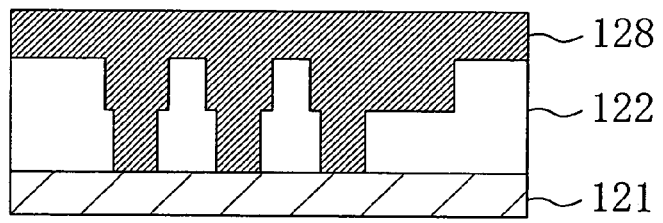
Figure 20D:
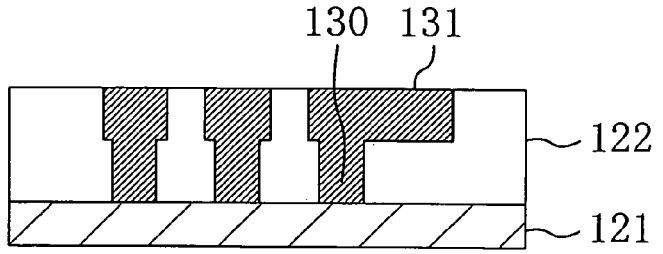

Next, as shown in FIG. 16B, after depositing a barrier metal film of Ta or TaN over the burnt film 62C including the insides of the first concave portions 65a and 65b and the second concave portion 67 by the sputtering method or the CVD, a metal film 68A is deposited over the barrier metal film. In this case, the metal film 68A can be deposited by the plating method on a seed layer formed on the barrier metal film by the sputtering. As the metal film 68A, a metal that can be deposited by the plating method and has low resistance, such as copper, gold, silver or platinum, is preferably used. Also, the metal film 68A may be deposited by the CVD instead of the plating method.

Then, an unnecessary portion of the metal film 68A, namely, a portion thereof exposed above the burnt film 62C, is removed by the CMP. Thus, a metal interconnect 68B and a plug 68C made of the metal film 68A are simultaneously formed in the burnt film 62C corresponding to an insulating film.

Although not shown in the drawings, when the aforementioned procedures are repeated, a multilayered interconnect structure including, in each layer, the interlayer insulating film of the burnt film 62C, the upper metal interconnect 68B and the plug 68C can be formed.

Since the interlayer insulating film made of the burnt film 62C with no global level difference can be formed in Embodiment 6, local concentration of film stress can be released, resulting in improving the reliability of the multi-layered interconnects.

Also, in the case where a mask pattern is formed on the interlayer insulating film made of the burnt film 62C by the lithography, degradation of a focal depth margin derived from a level difference can be suppressed. Therefore, as compared with conventional technique, a process margin (process window) can be increased, resulting in forming a highly accurate semiconductor device.

In the case where a film largely outgassing in the burning process is used as the flowable film 62A in Embodiment 6, the burning process of Embodiment 2 is more effectively employed than that of Embodiment 1. In the case where the flowable film 62A is made of a general film, the concentration of a solvent remaining in the film can be controlled through the pre-bake, and hence, the film minimally outgases in the burning process. However, depending upon the composition of the film, it may largely outgas in the burning process where it is annealed at a comparatively high temperature in some cases. In such a case, when the burning process of Embodiment 1 is employed, there arises a problem of uniformity or stability in the burnt film 62C, and hence, the burning process of Embodiment 2 is preferably employed.

In particular, when the burnt film 62C is a porous film, the burning process of Embodiment 2 is effectively employed. In a porous film, most of the basic structure of the film is formed in the solidifying process, and a pore forming material added for forming pores is vaporized in the following burning process. Therefore, the burning process of Embodiment 2 where the film is burnt with the pressing member 63 moved away from the solidified film 62B is suitable. However, even in using a porous film, when a material in which the basic skeleton of the film is formed and a pore forming material is vaporized simultaneously in the solidifying process is used, a good burnt film 62C can be obtained even by employing the burning process of Embodiment 1.

What is claimed is:

1. A method for forming a semiconductor device comprising the steps of:
   forming a flowable film made of an insulating material with flowability;
   forming a first concave portion in said flowable film though transfer of a convex portion of a pressing face of a pressing member by pressing said pressing face against said flowable film;
   forming a solidified film having said first concave portion by solidifying said flowable film though annealing of said flowable film performed at a first temperature with said pressing face pressed against said flowable film;
   forming a burnt film having said first concave portion by burning said solidified film through annealing of said solidified film performed at a second temperature higher than said first temperature;
   forming a second concave portion connected at least to said first concave portion in said burnt film by forming, on said burnt film, a mask having an opening for forming said second concave portion and etching said burnt film by using said mask; and
   forming a plug and a metal interconnect made of a metal material by filing said first concave portion and said second concave portion of said burnt film with said metal film,
   wherein said first concave portion corresponds to an interconnect groove and said second concave portion corresponds to a via hole.

2. The method for forming a semiconductor device of claim 1, wherein said first temperature is approximately 150° C. through approximately 300° C.

3. The method for forming a semiconductor device of claim 1, wherein said second temperature is approximately 350° C. through approximately 450° C.

4. The method for forming a semiconductor device of claim 1, wherein said insulating material with flowability is in the form of a liquid or a gel.

5. The method for forming a semiconductor device of claim 1, wherein in the step of forming a flowable film, said flowable film is formed on a substrate by supplying said insulating material with flowability onto a substrate rotated.

6. The method for forming a semiconductor device of claim 1, wherein in the step of forming a flowable film, said flowable film is formed on a substrate by supplying said insulating material with flowability onto said substrate and rotating said substrate after the supply.

7. The method for forming a semiconductor device of claim 1, wherein in the step of forming a flowable film, said flowable film is formed on a substrate by supplying, in the form of a shower or a spray, said insulating material with flowability onto said substrate rotated.

8. The method for forming a semiconductor device of claim 1, wherein in the step of forming a flowable film, said flowable film is formed on a substrate by supplying said insulating material with flowability from a fine spray vent of a nozzle onto said substrate with said nozzle having said fine spray vent and said substrate relatively moved along plane directions.

9. The method for forming a semiconductor device of claim 1, wherein in the step of forming a flowable film, said flowable film is formed on a substrate by supplying said insulating material with flowability having been adhered to a surface of a roller onto said substrate with said roller rotated.

10. The method for forming a semiconductor device of claim 1, further comprising, between the step of forming a flowable film and the step of forming a first concave portion, a step of selectively removing a peripheral portion of said flowable film.

11. The method for forming a semiconductor device of claim 10, wherein the step of selectively removing a peripheral portion of said flowable film is performed by supplying a solution for dissolving said insulating material with flowability onto said peripheral portion of said flowable film with said flowable film rotated.

12. The method for forming a semiconductor device of claim 1, wherein said flowable film is formed on a substrate, and in the step of forming a first concave portion, a plurality of distances between a surface of said substrate and said pressing face are measured, and said flowable film is pressed with said pressing face in such a manner that said plurality of distances are equal to one another.

13. The method for forming a semiconductor device of claim 12, wherein said plurality of distances are measured by measuring capacitance per unit area in respective measurement positions.

14. The method for forming a semiconductor device of claim 1, wherein said flowable film is formed on a substrate, in the step of forming a first concave portion, a plurality of distances between a surface of a stage where said substrate is placed and said pressing face are measured, and said flowable film is pressed with said pressing face in such a manner that said plurality of distances are equal to one another.

15. The method for forming a semiconductor device of claim 1, wherein said pressing face of said pressing member has a hydrophobic property.

16. The method for forming a semiconductor device of claim 1, wherein said insulating material with flowability is an organic material, an inorganic material, an organic-inorganic material, a photo-setting resin or a photosensitive resin.

17. The method for forming a semiconductor device of claim 1, wherein in the step of forming a burnt film, said solidified film is annealed at said second temperature with said pressing face moved away from said solidified film.

18. The method for forming a semiconductor device of claim 1, wherein said burnt film has a dielectric constant of approximately 4 or less.

19. A method for forming a semiconductor device comprising the steps of:
   forming a flowable film made of an insulating material with flowability;
   forming a first concave portion in said flowable film through transfer of a convex portion of a pressing face of a pressing member by pressing said pressing face against said flowable film;
   forming a solidified film having said first concave portion by solidifying said flowable film through annealing of said flowable film performed at a first temperature with said pressing face pressed against said flowable film;
   forming a burnt film having said first concave portion by burning said solidified film through annealing of said solidified film performed at a second temperature higher than said first temperature;

forming a second concave portion connected at least to said first concave portion in said burnt film by forming, on said burnt film, a mask having an opening for forming said second concave portion and etching said burnt film by using said mask; and forming a plug and a metal interconnect made of a metal material by filing said first concave portion and said second concave portion of said burnt film with said metal film, wherein said first concave portion corresponds to a via hole and said second concave portion corresponds to an interconnect groove.

20. The method for forming a semiconductor device of claim 19, wherein said first temperature is approximately 150° C. through approximately 300° C.

21. The method for forming a semiconductor device of claim 19, wherein said second temperature is approximately 350° C. through approximately 450° C.

22. The method for forming a semiconductor device of claim 19, wherein said insulating material with flowability is in the form of a liquid or a gel.

23. The method for forming a semiconductor device of claim 19, wherein in the step of forming a flowable film, said flowable film is formed on a substrate by supplying said insulating material with flowability onto a substrate rotated.

24. The method for forming a semiconductor device of claim 19, wherein in the step of forming a flowable film, said flowable film is formed on a substrate by supplying said insulating material with flowability onto said substrate and rotating said substrate after the supply.

25. The method for forming a semiconductor device of claim 19, wherein in the step of forming a flowable film, said flowable film is formed on a substrate by supplying, in the form of a shower or a spray, said insulating material with flowability onto said substrate rotated.

26. The method for forming a semiconductor device of claim 19, wherein in the step of forming a flowable film, said flowable film is formed on a substrate by supplying said insulating material with flowability from a fine spray vent of a nozzle onto said substrate with said nozzle having said fine spray vent and said substrate relatively moved along plane directions.

27. The method for forming a semiconductor device of claim 19, wherein in the step of forming a flowable film, said flowable film is formed on a substrate by supplying said insulating material with flowability having been adhered to a surface of a roller onto said substrate with said roller rotated.

28. The method for forming a semiconductor device of claim 19, further comprising, between the step of forming a flowable film and the step of forming a first concave portion, a step of selectively removing a peripheral portion of said flowable film.

29. The method for forming a semiconductor device of claim 19, wherein said flowable film is formed on a substrate, and in the step of forming a first concave portion, a plurality of distances between a surface of a stage where said substrate is placed and said pressing face are measured, and said flowable film is pressed with said pressing face in such a manner that said plurality of distances are equal to one another.

30. The method for forming a semiconductor device of claim 28, wherein the step of selectively removing a peripheral portion of said flowable film is performed by supplying a solution for dissolving said insulating material with flowability onto said peripheral portion of said flowable film with said flowable film rotated.

31. The method for forming a semiconductor device of claim 30, wherein said plurality of distances are measured by measuring capacitance per unit area in respective measurement positions.

32. The method for forming a semiconductor device of claim 19, wherein said flowable film is formed on a substrate, in the step of forming a first concave portion, a plurality of distances between a surface of a stage where said substrate is placed and said pressing face are measured, and said flowable film is pressed with said pressing face in such a manner that said plurality of distances are equal to one another.

33. The method for forming a semiconductor device of claim 19, wherein said pressing face of said pressing member has a hydrophobic property.

34. The method for forming a semiconductor device of claim 19, wherein said insulating material with flowability is an organic material, an inorganic material, an organic-inorganic material, a photo-setting resin or a photosensitive resin.

35. The method for forming a semiconductor device of claim 19, wherein in the step of forming a burnt film, said solidified film is annealed at said second temperature with said pressing face moved away from said solidified film.

36. The method for forming a semiconductor device of claim 19, wherein said burnt film has a dielectric constant of approximately 4 or less.

37. A method for forming a semiconductor device comprising the steps of:

forming a flowable film made of an insulating material with flowability;

forming a first concave portion in said flowable film through transfer of a convex portion of a pressing face of a pressing member by pressing said pressing face against said flowable film;

forming a solidified film having said first concave portion by solidifying said flowable film through annealing of said flowable film performed at a first temperature with said pressing face pressed against said flowable film;

forming a burnt film having said first concave portion by burning said solidified film through annealing of said solidified film performed at a second temperature higher than said first temperature;

forming a second concave portion connected at least to said first concave portion in said burnt film by forming, on said burnt film, a mask having an opening for forming said second concave portion and etching said burnt film by using said mask; and forming a plug and a metal interconnect made of a metal material by filing said first concave portion and said second concave portion of said burnt film with said metal film, further comprising, between the step of forming a flowable film and the step of forming a first concave portion, a step of selectively removing a peripheral portion of said flowable film, wherein the step of selectively removing a peripheral portion of said flowable film is performed by modifying said peripheral portion of said flowable film through irradiation with light and removing said modified peripheral portion.

38. A method for forming a semiconductor device comprising the steps of:

forming a flowable film made of an insulating material with flowability;

forming a first concave portion in said flowable film through transfer of a convex portion of a pressing face of a pressing member by pressing said pressing face against said flowable film;

forming a solidified film having said first concave portion by solidifying said flowable film through annealing of said flowable film performed at a first temperature with said pressing face pressed against said flowable film;

forming a burnt film having said first concave portion by burning said solidified film through annealing of said solidified film performed at a second temperature higher than said first temperature;

forming a second concave portion connected at least to said first concave portion in said burnt film by forming, on said burnt film, a mask having an opening for forming said second concave portion and etching said burnt film by using said mask; and forming a plug and a metal interconnect made of a metal material by filing said first concave portion and said second concave portion of said burnt film with said metal film, wherein said insulating material with flowability is a photo-setting resin, and the step of forming a solidified film includes a sub-step of irradiating said flowable film with light.

39. A method for forming a semiconductor device comprising the steps of:

forming a flowable film made of an insulating material with flowability;

forming a first concave portion in said flowable film though transfer of a convex portion of a pressing face of a pressing member by pressing said pressing face against said flowable film;

forming a solidified film having said first concave portion by solidifying said flowable film through annealing of said flowable film performed at a first temperature with said pressing face pressed against said flowable film;

forming a burnt film having said first concave portion by burning said solidified film through annealing of said solidified film performed at a second temperature higher than said first temperature;

forming a second concave portion connected at least to said first concave portion in said burnt film by forming, on said burnt film, a mask having an opening for forming said second concave portion and etching said burnt film by using said mask; and forming a plug and a metal interconnect made of a metal material by filing said first concave portion and said second concave portion of said burnt film with said metal film, wherein in the step of forming a burnt film, said solidified film is annealed at said second temperature with said pressing face pressed against said solidified film.

40. A method for forming a semiconductor device comprising the steps of:

forming a flowable film made of an insulating material with flowability;

forming a first concave portion in said flowable film through transfer of a convex portion of a pressing face of a pressing member by pressing said pressing face against said flowable film;

forming a solidified film having said first concave portion by solidifying said flowable film through annealing of said flowable film performed at a first temperature with said pressing face pressed against said flowable film;

forming a burnt film having said first concave portion by burning said solidified film through annealing of said solidified film performed at a second temperature higher than said first temperature;

forming a second concave portion connected at least to said first concave portion in said burnt film by forming, on said burnt film, a mask having an opening for forming said second concave portion and etching said burnt film by using said mask; and forming a plug and a metal interconnect made of a metal material by filing said first concave portion and said second concave portion of said burnt film with said metal film, wherein said burnt film is a porous film.

* * * * *